(12) United States Patent
Czinger et al.

(10) Patent No.: US 10,940,609 B2
(45) Date of Patent: Mar. 9, 2021

(54) METHODS AND APPARATUS FOR ADDITIVELY MANUFACTURED ENDOSKELETON-BASED TRANSPORT STRUCTURES

(71) Applicant: DIVERGENT TECHNOLOGIES, INC., Los Angeles, CA (US)

(72) Inventors: Kevin Robert Czinger, Santa Monica, CA (US); Broc William TenHouten, Rancho Palos Verdes, CA (US); Stuart Paul Macey, Laguna Niguel, CA (US); David Charles O'Connell, Huntington Beach, CA (US); Jon Paul Gunner, Palos Verdes Estates, CA (US); Antonio Bernerd Martinez, El Segundo, CA (US); Narender Shankar Lakshman, Torrance, CA (US)

(73) Assignee: Divergent Technologies, Inc., Los Angeles, CA (US)

( * ) Notice: Subject to any disclaimer, the term of this patent is extended or adjusted under 35 U.S.C. 154(b) by 228 days.

(21) Appl. No.: 15/659,607

(22) Filed: Jul. 25, 2017

(65) Prior Publication Data
US 2019/0030751 A1  Jan. 31, 2019

(51) Int. Cl.
  *B62D 65/02*  (2006.01)
  *B62D 25/00*  (2006.01)
  (Continued)

(52) U.S. Cl.
  CPC .............. *B28B 1/001* (2013.01); *B22F 3/002* (2013.01); *B22F 3/1055* (2013.01); *B22F 5/10* (2013.01);
  (Continued)

(58) Field of Classification Search
  CPC ........ B62D 25/00; B62D 21/15; B62D 65/02; B33Y 80/00; B33Y 10/00; B33Y 40/02;
  (Continued)

(56) References Cited

U.S. PATENT DOCUMENTS

| | | |
|---|---|---|
| 5,203,226 A | 4/1993 | Hongou et al. |
| 5,742,385 A | 4/1998 | Champa |

(Continued)

FOREIGN PATENT DOCUMENTS

| | | |
|---|---|---|
| DE | 201620105052 U1 | 4/2017 |
| WO | 1996036455 A1 | 11/1996 |

(Continued)

OTHER PUBLICATIONS

US 9,202,136 B2, 12/2015, Schmidt et al. (withdrawn)
(Continued)

*Primary Examiner* — Gregory A Blankenship
(74) *Attorney, Agent, or Firm* — Arent Fox LLP

(57) ABSTRACT

Some embodiments of the present disclosure relate to an additively manufactured transport structure. The transport structure includes cavities into which components that use an external interface are inserted. A plurality of components are assembled and integrated into the vehicle. In an embodiment, the components and frame are modular, enabling reparability and replacement of single parts in the event of isolated failures.

46 Claims, 21 Drawing Sheets

(51) Int. Cl.

| | |
|---|---|
| *B33Y 80/00* | (2015.01) |
| *B21B 1/00* | (2006.01) |
| *B28B 1/00* | (2006.01) |
| *B23K 26/342* | (2014.01) |
| *B23K 26/38* | (2014.01) |
| *B23K 26/40* | (2014.01) |
| *B23K 26/00* | (2014.01) |
| *B22F 3/105* | (2006.01) |
| *B22F 5/10* | (2006.01) |
| *G06F 30/15* | (2020.01) |
| *B29C 64/124* | (2017.01) |
| *B29C 64/153* | (2017.01) |
| *B22F 3/00* | (2021.01) |
| *B62D 27/02* | (2006.01) |
| *B23K 101/28* | (2006.01) |
| *B23K 103/10* | (2006.01) |
| *B29C 64/10* | (2017.01) |
| *B23K 103/08* | (2006.01) |
| *B23K 103/14* | (2006.01) |
| *B23K 103/04* | (2006.01) |
| *B33Y 10/00* | (2015.01) |
| *B33Y 30/00* | (2015.01) |
| *B33Y 50/02* | (2015.01) |
| *B23K 26/21* | (2014.01) |
| *B23K 101/00* | (2006.01) |
| *B22F 3/115* | (2006.01) |

(52) U.S. Cl.
CPC ........ *B23K 26/0006* (2013.01); *B23K 26/342* (2015.10); *B23K 26/38* (2013.01); *B23K 26/40* (2013.01); *B29C 64/124* (2017.08); *B29C 64/153* (2017.08); *B33Y 80/00* (2014.12); *B62D 27/023* (2013.01); *G06F 30/15* (2020.01); *B22F 3/008* (2013.01); *B22F 3/115* (2013.01); *B22F 2003/1058* (2013.01); *B22F 2999/00* (2013.01); *B23K 26/21* (2015.10); *B23K 2101/006* (2018.08); *B23K 2101/28* (2018.08); *B23K 2103/04* (2018.08); *B23K 2103/10* (2018.08); *B23K 2103/14* (2018.08); *B23K 2103/15* (2018.08); *B29C 64/10* (2017.08); *B33Y 10/00* (2014.12); *B33Y 30/00* (2014.12); *B33Y 50/02* (2014.12); *B62D 65/02* (2013.01)

(58) Field of Classification Search
CPC .. B28B 1/001; B23K 26/342; B23K 26/0006; B23K 26/38; B23K 26/40; B29C 64/10; B29C 64/124; B29C 64/153; B29C 64/342; B22F 5/10
USPC ........................................ 296/203.01–203.04
See application file for complete search history.

(56) References Cited

U.S. PATENT DOCUMENTS

| | | | |
|---|---|---|---|
| 5,990,444 A | 11/1999 | Costin | |
| 6,010,155 A | 1/2000 | Rinehart | |
| 6,036,201 A | 3/2000 | Pond et al. | |
| 6,096,249 A | 8/2000 | Yamaguchi | |
| 6,140,602 A | 10/2000 | Costin | |
| 6,250,533 B1 | 6/2001 | Otterbein et al. | |
| 6,252,196 B1 | 6/2001 | Costin et al. | |
| 6,318,642 B1 | 11/2001 | Goenka et al. | |
| 6,365,057 B1 | 4/2002 | Whitehurst et al. | |
| 6,391,251 B1 | 5/2002 | Keicher et al. | |
| 6,409,930 B1 | 6/2002 | Whitehurst et al. | |
| 6,468,439 B1 | 10/2002 | Whitehurst et al. | |
| 6,554,345 B2 | 4/2003 | Jonsson | |
| 6,585,151 B1 | 7/2003 | Ghosh | |
| 6,644,721 B1 | 11/2003 | Miskech et al. | |
| 6,811,744 B2 | 11/2004 | Keicher et al. | |
| 6,866,497 B2 | 3/2005 | Saiki | |
| 6,919,035 B1 | 7/2005 | Clough | |
| 6,926,970 B2 | 8/2005 | James et al. | |
| 7,152,292 B2 | 12/2006 | Hohmann et al. | |
| 7,344,186 B1 | 3/2008 | Hausler et al. | |
| 7,469,956 B2 | 12/2008 | Yasuhara et al. | |
| 7,500,373 B2 | 3/2009 | Quell | |
| 7,586,062 B2 | 9/2009 | Heberer | |
| 7,637,134 B2 | 12/2009 | Burzlaff et al. | |
| 7,710,347 B2 | 5/2010 | Gentilman et al. | |
| 7,716,802 B2 | 5/2010 | Stern et al. | |
| 7,745,293 B2 | 6/2010 | Yamazaki et al. | |
| 7,766,123 B2 | 8/2010 | Sakurai et al. | |
| 7,852,388 B2 | 12/2010 | Shimizu et al. | |
| 7,908,922 B2 | 3/2011 | Zarabadi et al. | |
| 7,951,324 B2 | 5/2011 | Naruse et al. | |
| 8,094,036 B2 | 1/2012 | Heberer | |
| 8,163,077 B2 | 4/2012 | Eron et al. | |
| 8,286,236 B2 | 10/2012 | Jung et al. | |
| 8,289,352 B2 | 10/2012 | Vartanian et al. | |
| 8,297,096 B2 | 10/2012 | Mizumura et al. | |
| 8,354,170 B1 | 1/2013 | Henry et al. | |
| 8,383,028 B2 | 2/2013 | Lyons | |
| 8,408,036 B2 | 4/2013 | Reith et al. | |
| 8,429,754 B2 | 4/2013 | Jung et al. | |
| 8,437,513 B1 | 5/2013 | Derakhshani et al. | |
| 8,444,903 B2 | 5/2013 | Lyons et al. | |
| 8,452,073 B2 | 5/2013 | Taminger et al. | |
| 8,599,301 B2 | 12/2013 | Dowski, Jr. et al. | |
| 8,606,540 B2 | 12/2013 | Haisty et al. | |
| 8,610,761 B2 | 12/2013 | Haisty et al. | |
| 8,631,996 B2 | 1/2014 | Quell et al. | |
| 8,675,925 B2 | 3/2014 | Derakhshani et al. | |
| 8,678,060 B2 | 3/2014 | Dietz et al. | |
| 8,686,314 B2 | 4/2014 | Schneegans et al. | |
| 8,686,997 B2 | 4/2014 | Radet et al. | |
| 8,694,284 B2 | 4/2014 | Berard | |
| 8,720,876 B2 | 5/2014 | Reith et al. | |
| 8,752,166 B2 | 6/2014 | Jung et al. | |
| 8,755,923 B2 | 6/2014 | Farahani et al. | |
| 8,787,628 B1 | 7/2014 | Derakhshani et al. | |
| 8,818,771 B2 | 8/2014 | Gielis et al. | |
| 8,873,238 B2 | 10/2014 | Wilkins | |
| 8,944,492 B2 * | 2/2015 | Hufnagl | B62D 21/183 296/190.01 |
| 8,978,535 B2 | 3/2015 | Ortiz et al. | |
| 9,006,605 B2 | 4/2015 | Schneegans et al. | |
| 9,071,436 B2 | 6/2015 | Jung et al. | |
| 9,101,979 B2 | 8/2015 | Hofmann et al. | |
| 9,104,921 B2 | 8/2015 | Derakhshani et al. | |
| 9,126,365 B1 | 9/2015 | Mark et al. | |
| 9,128,476 B2 | 9/2015 | Jung et al. | |
| 9,138,924 B2 | 9/2015 | Yen | |
| 9,149,988 B2 | 10/2015 | Mark et al. | |
| 9,156,205 B2 | 10/2015 | Mark et al. | |
| 9,186,848 B2 | 11/2015 | Mark et al. | |
| 9,244,986 B2 | 1/2016 | Karmarkar | |
| 9,248,611 B2 | 2/2016 | Divine et al. | |
| 9,254,535 B2 | 2/2016 | Buller et al. | |
| 9,266,566 B2 | 2/2016 | Kim | |
| 9,269,022 B2 | 2/2016 | Rhoads et al. | |
| 9,327,452 B2 | 5/2016 | Mark et al. | |
| 9,329,020 B1 | 5/2016 | Napoletano | |
| 9,332,251 B2 | 5/2016 | Haisty et al. | |
| 9,346,127 B2 | 5/2016 | Buller et al. | |
| 9,389,315 B2 | 7/2016 | Bruder et al. | |
| 9,399,256 B2 | 7/2016 | Buller et al. | |
| 9,403,235 B2 | 8/2016 | Buller et al. | |
| 9,418,193 B2 | 8/2016 | Dowski, Jr. et al. | |
| 9,457,514 B2 | 10/2016 | Schwärzler | |
| 9,469,057 B2 | 10/2016 | Johnson et al. | |
| 9,478,063 B2 | 10/2016 | Rhoads et al. | |
| 9,481,402 B1 | 11/2016 | Muto et al. | |
| 9,486,878 B2 | 11/2016 | Buller et al. | |
| 9,486,960 B2 | 11/2016 | Paschkewitz et al. | |
| 9,502,993 B2 | 11/2016 | Deng | |

(56) References Cited

U.S. PATENT DOCUMENTS

| | | |
|---|---|---|
| 9,525,262 B2 | 12/2016 | Stuart et al. |
| 9,533,526 B1 | 1/2017 | Nevins |
| 9,555,315 B2 | 1/2017 | Aders |
| 9,555,580 B1 | 1/2017 | Dykstra et al. |
| 9,557,856 B2 | 1/2017 | Send et al. |
| 9,566,742 B2 | 2/2017 | Keating et al. |
| 9,566,758 B2 | 2/2017 | Cheung et al. |
| 9,567,013 B2 | 2/2017 | Erlich et al. |
| 9,573,193 B2 | 2/2017 | Buller et al. |
| 9,573,225 B2 | 2/2017 | Buller et al. |
| 9,586,290 B2 | 3/2017 | Buller et al. |
| 9,595,795 B2 | 3/2017 | Lane et al. |
| 9,597,843 B2 | 3/2017 | Stauffer et al. |
| 9,600,929 B1 | 3/2017 | Young et al. |
| 9,609,755 B2 | 3/2017 | Coull et al. |
| 9,610,737 B2 | 4/2017 | Johnson et al. |
| 9,611,667 B2 | 4/2017 | GangaRao et al. |
| 9,616,623 B2 | 4/2017 | Johnson et al. |
| 9,626,487 B2 | 4/2017 | Jung et al. |
| 9,626,489 B2 | 4/2017 | Nilsson |
| 9,643,361 B2 | 5/2017 | Liu |
| 9,662,840 B1 | 5/2017 | Buller et al. |
| 9,665,182 B2 | 5/2017 | Send et al. |
| 9,672,389 B1 | 6/2017 | Mosterman et al. |
| 9,672,550 B2 | 6/2017 | Apsley et al. |
| 9,676,145 B2 | 6/2017 | Buller et al. |
| 9,684,919 B2 | 6/2017 | Apsley et al. |
| 9,688,032 B2 | 6/2017 | Kia et al. |
| 9,690,286 B2 | 6/2017 | Hovsepian et al. |
| 9,700,966 B2 | 7/2017 | Kraft et al. |
| 9,703,896 B2 | 7/2017 | Zhang et al. |
| 9,713,903 B2 | 7/2017 | Paschkewitz et al. |
| 9,718,302 B2 | 8/2017 | Young et al. |
| 9,718,434 B2 | 8/2017 | Hector, Jr. et al. |
| 9,724,877 B2 | 8/2017 | Flitsch et al. |
| 9,724,881 B2 | 8/2017 | Johnson et al. |
| 9,725,178 B2 | 8/2017 | Wang |
| 9,731,730 B2 | 8/2017 | Stiles |
| 9,731,773 B2 | 8/2017 | Gami et al. |
| 9,741,954 B2 | 8/2017 | Bruder et al. |
| 9,747,352 B2 | 8/2017 | Karmarkar |
| 9,764,415 B2 | 9/2017 | Seufzer et al. |
| 9,764,520 B2 | 9/2017 | Johnson et al. |
| 9,765,226 B2 | 9/2017 | Dain |
| 9,770,760 B2 | 9/2017 | Liu |
| 9,773,393 B2 | 9/2017 | Velez |
| 9,776,234 B2 | 10/2017 | Schaafhausen et al. |
| 9,782,936 B2 | 10/2017 | Glunz et al. |
| 9,783,324 B2 | 10/2017 | Embler et al. |
| 9,783,977 B2 | 10/2017 | Alqasimi et al. |
| 9,789,548 B2 | 10/2017 | Golshany et al. |
| 9,789,922 B2 | 10/2017 | Dosenbach et al. |
| 9,796,137 B2 | 10/2017 | Zhang et al. |
| 9,802,108 B2 | 10/2017 | Aders |
| 9,809,977 B2 | 11/2017 | Carney et al. |
| 9,817,922 B2 | 11/2017 | Glunz et al. |
| 9,818,071 B2 | 11/2017 | Jung et al. |
| 9,821,339 B2 | 11/2017 | Paschkewitz et al. |
| 9,821,411 B2 | 11/2017 | Buller et al. |
| 9,823,143 B2 | 11/2017 | Twelves, Jr. et al. |
| 9,829,564 B2 | 11/2017 | Bruder et al. |
| 9,846,933 B2 | 12/2017 | Yuksel |
| 9,854,828 B2 | 1/2018 | Langeland |
| 9,858,604 B2 | 1/2018 | Apsley et al. |
| 9,862,833 B2 | 1/2018 | Hasegawa et al. |
| 9,862,834 B2 | 1/2018 | Hasegawa et al. |
| 9,863,885 B2 | 1/2018 | Zaretski et al. |
| 9,870,629 B2 | 1/2018 | Cardno et al. |
| 9,879,981 B1 | 1/2018 | Dehghan Niri et al. |
| 9,884,663 B2 * | 2/2018 | Czinger ............... B62D 23/005 |
| 9,898,776 B2 | 2/2018 | Apsley et al. |
| 9,914,150 B2 | 3/2018 | Pettersson et al. |
| 9,919,360 B2 | 3/2018 | Buller et al. |
| 9,931,697 B2 | 4/2018 | Levin et al. |
| 9,933,031 B2 | 4/2018 | Bracamonte et al. |
| 9,933,092 B2 | 4/2018 | Sindelar |
| 9,957,031 B2 | 5/2018 | Golshany et al. |
| 9,958,535 B2 | 5/2018 | Send et al. |
| 9,962,767 B2 | 5/2018 | Buller et al. |
| 9,963,978 B2 | 5/2018 | Johnson et al. |
| 9,971,920 B2 | 5/2018 | Derakhshani et al. |
| 9,976,063 B2 | 5/2018 | Childers et al. |
| 9,987,792 B2 | 6/2018 | Flitsch et al. |
| 9,988,136 B2 | 6/2018 | Tiryaki et al. |
| 9,989,623 B2 | 6/2018 | Send et al. |
| 9,990,565 B2 | 6/2018 | Rhoads et al. |
| 9,994,339 B2 | 6/2018 | Colson et al. |
| 9,996,890 B1 | 6/2018 | Cinnamon et al. |
| 9,996,945 B1 | 6/2018 | Holzer et al. |
| 10,002,215 B2 | 6/2018 | Dowski et al. |
| 10,006,156 B2 | 6/2018 | Kirkpatrick |
| 10,011,089 B2 | 7/2018 | Lyons et al. |
| 10,011,685 B2 | 7/2018 | Childers et al. |
| 10,012,532 B2 | 7/2018 | Send et al. |
| 10,013,777 B2 | 7/2018 | Mariampillai et al. |
| 10,015,908 B2 | 7/2018 | Williams et al. |
| 10,016,852 B2 | 7/2018 | Broda |
| 10,016,942 B2 | 7/2018 | Mark et al. |
| 10,017,384 B1 | 7/2018 | Greer et al. |
| 10,018,576 B2 | 7/2018 | Herbsommer et al. |
| 10,022,792 B2 | 7/2018 | Srivas et al. |
| 10,022,912 B2 | 7/2018 | Kia et al. |
| 10,027,376 B2 | 7/2018 | Sankaran et al. |
| 10,029,415 B2 | 7/2018 | Swanson et al. |
| 10,040,239 B2 | 8/2018 | Brown, Jr. |
| 10,046,412 B2 | 8/2018 | Blackmore |
| 10,048,769 B2 | 8/2018 | Selker et al. |
| 10,052,712 B2 | 8/2018 | Blackmore |
| 10,052,820 B2 | 8/2018 | Kemmer et al. |
| 10,055,536 B2 | 8/2018 | Maes et al. |
| 10,058,764 B2 | 8/2018 | Aders |
| 10,058,920 B2 | 8/2018 | Buller et al. |
| 10,061,906 B2 | 8/2018 | Nilsson |
| 10,065,270 B2 | 9/2018 | Buller et al. |
| 10,065,361 B2 | 9/2018 | Susnjara et al. |
| 10,065,367 B2 | 9/2018 | Brown, Jr. |
| 10,068,316 B1 | 9/2018 | Holzer et al. |
| 10,071,422 B2 | 9/2018 | Buller et al. |
| 10,071,525 B2 | 9/2018 | Susnjara et al. |
| 10,072,179 B2 | 9/2018 | Drijfhout |
| 10,074,128 B2 | 9/2018 | Colson et al. |
| 10,076,875 B2 | 9/2018 | Mark et al. |
| 10,076,876 B2 | 9/2018 | Mark et al. |
| 10,081,140 B2 | 9/2018 | Paesano et al. |
| 10,081,391 B1 * | 9/2018 | Tyan ..................... B62D 25/00 |
| 10,081,431 B2 | 9/2018 | Seack et al. |
| 10,086,568 B2 | 10/2018 | Snyder et al. |
| 10,087,320 B2 | 10/2018 | Simmons et al. |
| 10,087,556 B2 | 10/2018 | Gallucci et al. |
| 10,099,427 B2 | 10/2018 | Mark et al. |
| 10,100,542 B2 | 10/2018 | GangaRao et al. |
| 10,100,890 B2 | 10/2018 | Bracamonte et al. |
| 10,107,344 B2 | 10/2018 | Bracamonte et al. |
| 10,108,766 B2 | 10/2018 | Druckman et al. |
| 10,113,600 B2 | 10/2018 | Bracamonte et al. |
| 10,118,347 B2 | 11/2018 | Stauffer et al. |
| 10,118,579 B2 | 11/2018 | Lakic |
| 10,120,078 B2 | 11/2018 | Bruder et al. |
| 10,124,546 B2 | 11/2018 | Johnson et al. |
| 10,124,570 B2 | 11/2018 | Evans et al. |
| 10,137,500 B2 | 11/2018 | Blackmore |
| 10,138,354 B2 | 11/2018 | Groos et al. |
| 10,144,126 B2 | 12/2018 | Krohne et al. |
| 10,145,110 B2 | 12/2018 | Carney et al. |
| 10,151,363 B2 | 12/2018 | Bracamonte et al. |
| 10,152,661 B2 | 12/2018 | Kieser |
| 10,160,278 B2 | 12/2018 | Coombs et al. |
| 10,161,021 B2 | 12/2018 | Lin et al. |
| 10,166,752 B2 | 1/2019 | Evans et al. |
| 10,166,753 B2 | 1/2019 | Evans et al. |
| 10,171,578 B1 | 1/2019 | Cook et al. |
| 10,173,255 B2 | 1/2019 | TenHouten et al. |
| 10,173,327 B2 | 1/2019 | Kraft et al. |
| 10,178,800 B2 | 1/2019 | Mahalingam et al. |

(56) References Cited

U.S. PATENT DOCUMENTS

| | | |
|---|---|---|
| 10,179,640 B2 | 1/2019 | Wilkerson |
| 10,183,330 B2 | 1/2019 | Buller et al. |
| 10,183,478 B2 | 1/2019 | Evans et al. |
| 10,189,187 B2 | 1/2019 | Keating et al. |
| 10,189,240 B2 | 1/2019 | Evans et al. |
| 10,189,241 B2 | 1/2019 | Evans et al. |
| 10,189,242 B2 | 1/2019 | Evans et al. |
| 10,190,424 B2 | 1/2019 | Johnson et al. |
| 10,195,693 B2 | 2/2019 | Buller et al. |
| 10,196,539 B2 | 2/2019 | Boonen et al. |
| 10,197,338 B2 | 2/2019 | Melsheimer |
| 10,200,677 B2 | 2/2019 | Trevor et al. |
| 10,201,932 B2 | 2/2019 | Flitsch et al. |
| 10,201,941 B2 | 2/2019 | Evans et al. |
| 10,202,673 B2 | 2/2019 | Lin et al. |
| 10,204,216 B2 | 2/2019 | Nejati et al. |
| 10,207,454 B2 | 2/2019 | Buller et al. |
| 10,209,065 B2 | 2/2019 | Estevo, Jr. et al. |
| 10,210,662 B2 | 2/2019 | Holzer et al. |
| 10,213,837 B2 | 2/2019 | Kondoh |
| 10,214,248 B2 | 2/2019 | Hall et al. |
| 10,214,252 B2 | 2/2019 | Schellekens et al. |
| 10,214,275 B2 | 2/2019 | Goehlich |
| 10,220,575 B2 | 3/2019 | Reznar |
| 10,220,881 B2 | 3/2019 | Tyan et al. |
| 10,221,530 B2 | 3/2019 | Driskell et al. |
| 10,226,900 B1 | 3/2019 | Nevins |
| 10,232,550 B2 | 3/2019 | Evans et al. |
| 10,234,342 B2 | 3/2019 | Moorlag et al. |
| 10,237,477 B2 | 3/2019 | Trevor et al. |
| 10,252,335 B2 | 4/2019 | Buller et al. |
| 10,252,336 B2 | 4/2019 | Buller et al. |
| 10,254,499 B1 | 4/2019 | Cohen et al. |
| 10,257,499 B2 | 4/2019 | Hintz et al. |
| 10,259,044 B2 | 4/2019 | Buller et al. |
| 10,268,181 B1 | 4/2019 | Nevins |
| 10,269,225 B2 | 4/2019 | Velez |
| 10,272,860 B2 | 4/2019 | Mohapatra et al. |
| 10,272,862 B2 | 4/2019 | Whitehead |
| 10,275,564 B2 | 4/2019 | Ridgeway et al. |
| 10,279,580 B2 | 5/2019 | Evans et al. |
| 10,285,219 B2 | 5/2019 | Fetfatsidis et al. |
| 10,286,452 B2 | 5/2019 | Buller et al. |
| 10,286,603 B2 | 5/2019 | Buller et al. |
| 10,286,961 B2 | 5/2019 | Hillebrecht et al. |
| 10,289,263 B2 | 5/2019 | Troy et al. |
| 10,289,875 B2 | 5/2019 | Singh et al. |
| 10,291,193 B2 | 5/2019 | Dandu et al. |
| 10,294,552 B2 | 5/2019 | Liu et al. |
| 10,294,982 B2 | 5/2019 | Gabrys et al. |
| 10,295,989 B1 | 5/2019 | Nevins |
| 10,303,159 B2 | 5/2019 | Czinger et al. |
| 10,307,824 B2 | 6/2019 | Kondoh |
| 10,310,197 B1 | 6/2019 | Droz et al. |
| 10,313,651 B2 | 6/2019 | Trevor et al. |
| 10,315,252 B2 | 6/2019 | Mendelsberg et al. |
| 10,336,050 B2 | 7/2019 | Susnjara |
| 10,337,542 B2 | 7/2019 | Hesslewood et al. |
| 10,337,952 B2 | 7/2019 | Bosetti et al. |
| 10,339,266 B2 | 7/2019 | Urick et al. |
| 10,343,330 B2 | 7/2019 | Evans et al. |
| 10,343,331 B2 | 7/2019 | McCall et al. |
| 10,343,355 B2 | 7/2019 | Evans et al. |
| 10,343,724 B2 | 7/2019 | Polewarczyk et al. |
| 10,343,725 B2 | 7/2019 | Martin et al. |
| 10,350,823 B2 | 7/2019 | Rolland et al. |
| 10,356,341 B2 | 7/2019 | Holzer et al. |
| 10,356,395 B2 | 7/2019 | Holzer et al. |
| 10,357,829 B2 | 7/2019 | Spink et al. |
| 10,357,957 B2 | 7/2019 | Buller et al. |
| 10,359,756 B2 | 7/2019 | Newell et al. |
| 10,369,629 B2 | 8/2019 | Mendelsberg et al. |
| 10,382,739 B1 | 8/2019 | Rusu et al. |
| 10,384,393 B2 | 8/2019 | Xu et al. |
| 10,384,416 B2 | 8/2019 | Cheung et al. |
| 10,389,410 B2 | 8/2019 | Brooks et al. |
| 10,391,710 B2 | 8/2019 | Mondesir |
| 10,392,097 B2 | 8/2019 | Pham et al. |
| 10,392,131 B2 | 8/2019 | Deck et al. |
| 10,393,315 B2 | 8/2019 | Tyan |
| 10,400,080 B2 | 9/2019 | Ramakrishnan et al. |
| 10,401,832 B2 | 9/2019 | Snyder et al. |
| 10,403,009 B2 | 9/2019 | Mariampillai et al. |
| 10,406,750 B2 | 9/2019 | Barton et al. |
| 10,412,283 B2 | 9/2019 | Send et al. |
| 10,416,095 B2 | 9/2019 | Herbsommer et al. |
| 10,421,496 B2 | 9/2019 | Swayne et al. |
| 10,421,863 B2 | 9/2019 | Hasegawa et al. |
| 10,422,478 B2 | 9/2019 | Leachman et al. |
| 10,425,793 B2 | 9/2019 | Sankaran et al. |
| 10,427,364 B2 | 10/2019 | Alves |
| 10,429,006 B2 | 10/2019 | Tyan et al. |
| 10,434,573 B2 | 10/2019 | Buller et al. |
| 10,435,185 B2 | 10/2019 | Divine et al. |
| 10,435,773 B2 | 10/2019 | Liu et al. |
| 10,436,038 B2 | 10/2019 | Buhler et al. |
| 10,438,407 B2 | 10/2019 | Pavanaskar et al. |
| 10,440,351 B2 | 10/2019 | Holzer et al. |
| 10,442,002 B2 | 10/2019 | Benthien et al. |
| 10,442,003 B2 | 10/2019 | Symeonidis et al. |
| 10,449,696 B2 | 10/2019 | Elgar et al. |
| 10,449,737 B2 | 10/2019 | Johnson et al. |
| 10,461,810 B2 | 10/2019 | Cook et al. |
| 2003/0230443 A1 | 12/2003 | Cramer et al. |
| 2006/0108783 A1 | 5/2006 | Ni et al. |
| 2009/0236182 A1 | 9/2009 | Yamagami |
| 2012/0104793 A1* | 5/2012 | Danielson ............ B62D 29/046 296/181.1 |
| 2014/0277669 A1 | 9/2014 | Nardi et al. |
| 2015/0183159 A1* | 7/2015 | Duty .................. B29C 67/0055 428/195.1 |
| 2016/0016229 A1* | 1/2016 | Czinger ................ B22F 3/1055 296/205 |
| 2017/0050677 A1* | 2/2017 | Czinger ................ B62D 21/17 |
| 2017/0057558 A1* | 3/2017 | Hillebrecht ............ B62D 21/02 |
| 2017/0113344 A1 | 4/2017 | Schönberg |
| 2017/0320267 A1* | 11/2017 | Lind .................... B29C 64/106 |
| 2017/0341309 A1 | 11/2017 | Piepenbrock et al. |
| 2017/0355003 A1* | 12/2017 | TenHouten ............ B21D 47/01 |
| 2018/0057058 A1* | 3/2018 | Tyan .................... B62D 21/00 |
| 2018/0057063 A1* | 3/2018 | Tyan .................... B62D 25/00 |
| 2018/0328435 A1* | 11/2018 | Tyan .................... B60R 19/34 |
| 2019/0030605 A1* | 1/2019 | TenHouten ............ B62D 31/02 |
| 2019/0030751 A1* | 1/2019 | Czinger ................ B33Y 80/00 |
| 2019/0143903 A1* | 5/2019 | Selvasekar ............ B60R 7/04 296/24.34 |

FOREIGN PATENT DOCUMENTS

| | | |
|---|---|---|
| WO | 1996036525 A1 | 11/1996 |
| WO | 1996038260 A1 | 12/1996 |
| WO | 2003024641 A1 | 3/2003 |
| WO | 2004108343 A1 | 12/2004 |
| WO | 2005093773 A1 | 10/2005 |
| WO | 2007003375 A1 | 1/2007 |
| WO | 2007110235 A1 | 10/2007 |
| WO | 2007110236 A1 | 10/2007 |
| WO | 2008019847 A1 | 2/2008 |
| WO | 2007128586 A3 | 6/2008 |
| WO | 2008068314 A2 | 6/2008 |
| WO | 2008086994 A1 | 7/2008 |
| WO | 2008087024 A1 | 7/2008 |
| WO | 2008107130 A1 | 9/2008 |
| WO | 2008138503 A1 | 11/2008 |
| WO | 2008145396 A1 | 12/2008 |
| WO | 2009083609 A2 | 7/2009 |
| WO | 2009098285 A1 | 8/2009 |
| WO | 2009112520 A1 | 9/2009 |
| WO | 2009135938 A1 | 11/2009 |
| WO | 2009140977 A1 | 11/2009 |
| WO | 2010125057 A2 | 11/2010 |
| WO | 2010125058 A1 | 11/2010 |
| WO | 2010142703 A2 | 12/2010 |

(56) References Cited

FOREIGN PATENT DOCUMENTS

| WO | 2011032533 A1 | 3/2011 |
|---|---|---|
| WO | 2014016437 A1 | 1/2014 |
| WO | 2014187720 A1 | 11/2014 |
| WO | 2014195340 A1 | 12/2014 |
| WO | 2015193331 A1 | 12/2015 |
| WO | 2016116414 A1 | 7/2016 |
| WO | 2017036461 A1 | 3/2017 |
| WO | 2019030248 A1 | 2/2019 |
| WO | 2019042504 A1 | 3/2019 |
| WO | 2019048010 A1 | 3/2019 |
| WO | 2019048498 A1 | 3/2019 |
| WO | 2019048680 A1 | 3/2019 |
| WO | 2019048682 A1 | 3/2019 |

OTHER PUBLICATIONS

US 9,809,265 B2, 11/2017, Kinjo (withdrawn)
US 10,449,880 B2, 10/2019, Mizobata et al. (withdrawn)
Local Motors Strati printing process https://www.youtube.com/watch?v=daioWlkH7Zl, Sep. 7, 2014 (Year: 2014).*
International Search Report and Written Opinion dated Nov. 28, 2018, regarding PCT/US2018/042081.
First China Office Action dated Jan. 14, 2019, regarding China Application No. CN201821172835.5.

* cited by examiner

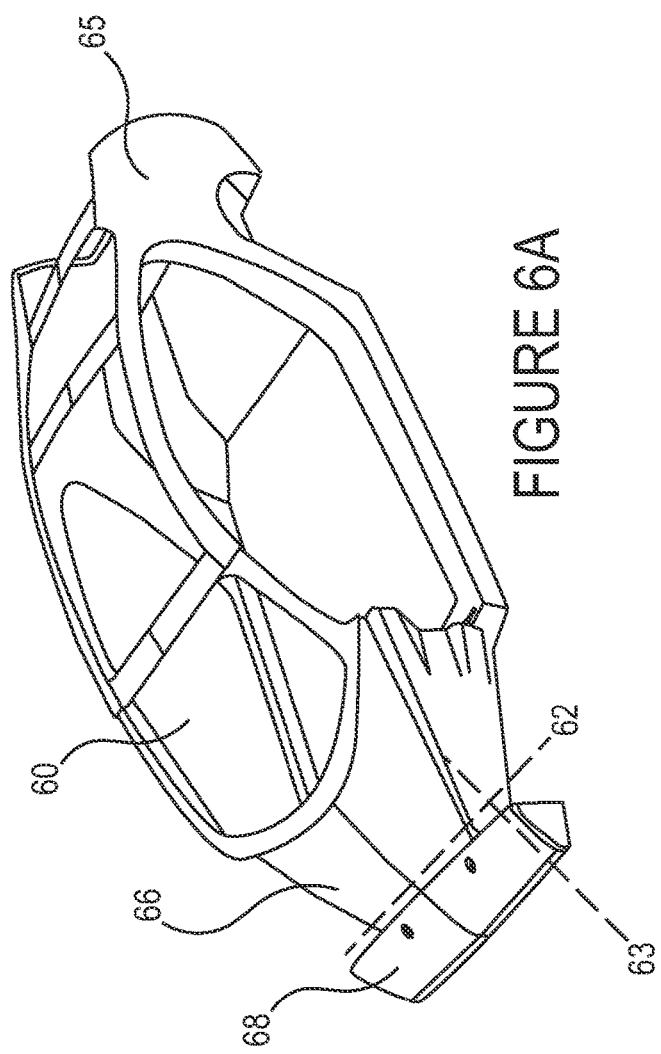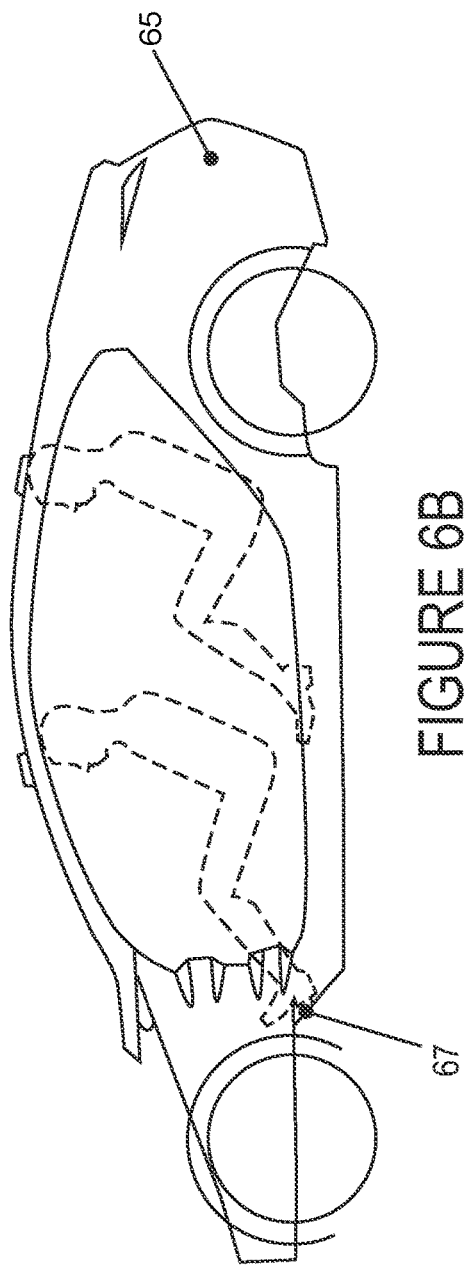
FIGURE 6A
FIGURE 6B

METHODS AND APPARATUS FOR ADDITIVELY MANUFACTURED ENDOSKELETON-BASED TRANSPORT STRUCTURES

BACKGROUND

Field

The present disclosure relates generally to techniques for additive manufacturing (AM), and more specifically to techniques for AM transport structures and substructures used as modular components in such transport structures.

Background

Additive Manufacturing (AM) processes involve the use of a stored geometrical model for accumulating layered materials on a 'build plate' to produce a three-dimensional (3-D) objects having features defined by the model. AM techniques are capable of printing complex components using a wide variety of materials. A 3-D object is fabricated based on a computer aided design (CAD) model. The AM process can create a solid three-dimensional object using the CAD model.

One such method is called Direct Metal Deposition (DMD). DMD is an AM technology that uses a laser to melt metallic powder and thereby transform it into a solid metal object. Unlike many of the other AM technologies, DMD is not based on a powder bed. Instead, DMD uses a feed nozzle to propel the powder into the laser beam. The powdered metal is then fused by the laser. While supports or a freeform substrate may in some cases be used to maintain the structure being built, almost all the powder in DMD is transformed into solid metal and consequently little waste powder is left to recycle. Using a layer by layer strategy, the print head, composed of the laser beam and the feed nozzle, can scan the substrate to deposit successive layers. All kinds of metallic materials can be processed using this technology including, for example, steel, aluminum, nickel alloys, titanium, cobalt, copper, and the like.

Other AM processes such as powder bed fusion (PBF) use a laser to sinter or melt powdered material, which then bonds the powder particles together in targeted areas to produce a 3-D structure having the desired geometry. Different materials or combinations of material, such as engineering plastics, thermoplastic elastomers, metals, and ceramics may be used in PBF to create the 3-D object. Other more advanced AM techniques, including those discussed further below, are also available or under current development, and each may be applicable to the teachings herein.

As AM processes continue to improve, manufacturers are increasingly investigating the benefits of using AM components in their designs. Despite recent advances in AM characteristics like build plate size, print speed and precision, and other progressively more sophisticated features of AM-based technology, the use of AM in the various transport structure industries has, for the most part, remained limited to producing relatively small scale components when compared to the size of the transport structure overall. Thus the potential for using AM to develop larger and increasingly sophisticated substructures of such mechanisms remains largely untapped.

SUMMARY

Several aspects of techniques for additively manufacturing (AM) a transport structure will be described more fully hereinafter with reference to three-dimensional printing techniques.

An aspect of a transport structure includes a 3-D printed frame having a structure configured to accept road loads and to protect an occupant in an impact event, a plurality of cavities, protruding through the 3-D printed frame, for a respective plurality of components requiring an external interface; and a body disposed over an exterior surface of the 3-D printed frame.

An aspect of a method for producing a transport structure includes 3-D printing a frame, the 3-D printed frame including a structure configured to accept road loads and to protect an occupant in an impact event.

The method further includes forming a body over an exterior surface of the 3-D printed frame.

The method also includes assemble a plurality of modular components into the 3-D printed frame, wherein the 3-D printed frame includes a plurality of cavities for housing components of the plurality of components requiring an external interface.

It will be understood that other aspects of additively manufacturing transport structures will become readily apparent to those skilled in the art from the following detailed description, wherein only several embodiments by way of illustration are shown and described. As will be realized by those skilled in the art, the additively manufacturing transport structures are capable of other and different embodiments and its several details are capable of modification in various other respects, all without departing from the invention. Accordingly, the drawings and detailed description are to be regarded as illustrative in nature and not as restrictive.

BRIEF DESCRIPTION OF THE DRAWINGS

Various aspects of the methods and apparatuses for additively manufacturing transport structures will now be presented in the detailed description by way of example, and not by way of limitation, in the accompanying drawings, wherein:

FIG. 6A illustrates a perspective view of a vehicle having a nosecone and a metal body in accordance with the concepts disclosed herein.

FIG. 6B shows a side view of the transport structure of FIG. 6A.

DETAILED DESCRIPTION

Figure 1:
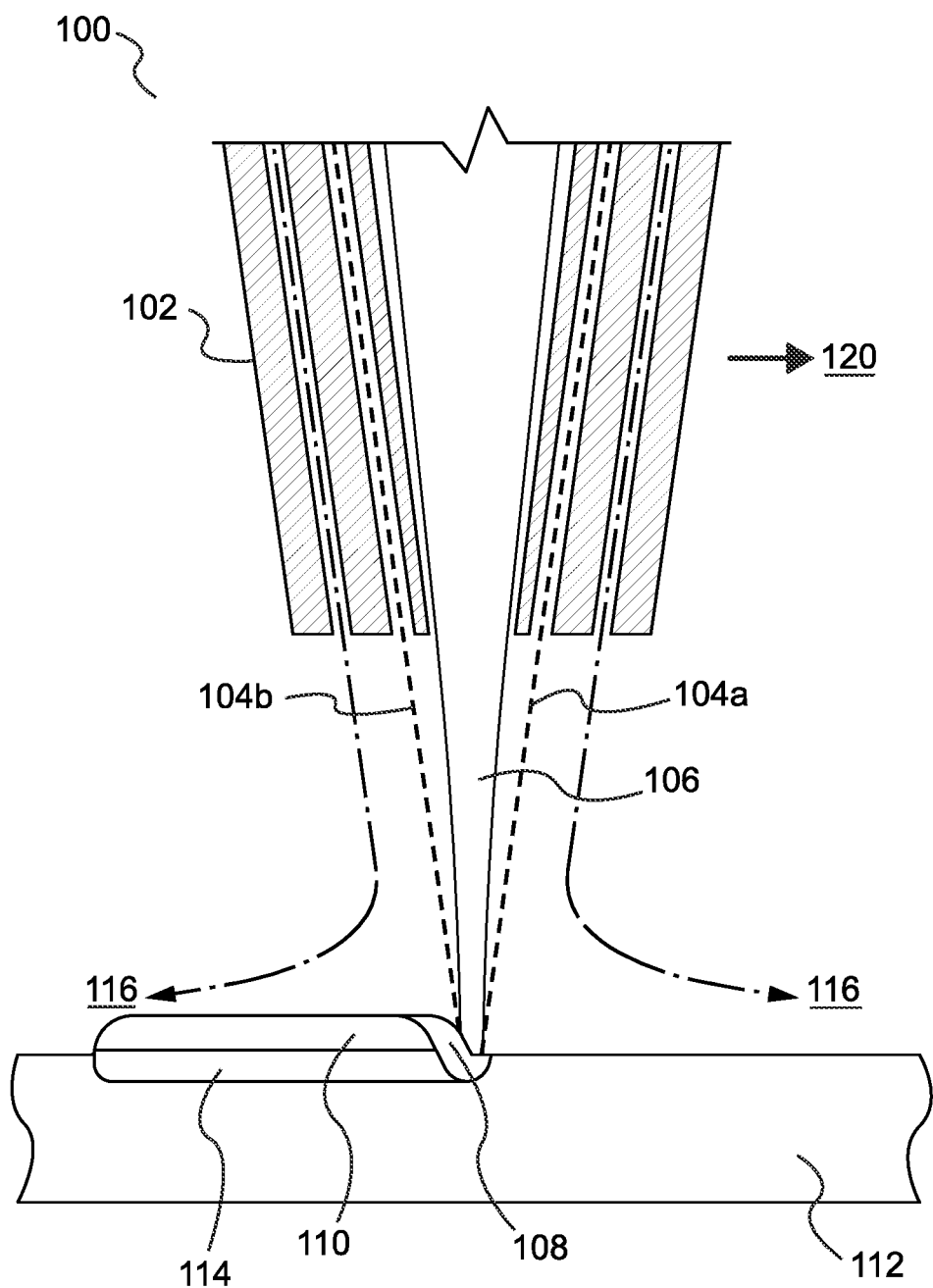
FIG. 1 illustrates an exemplary embodiment of certain aspects of a Direct Metal Deposition (DMD) 3-D printer.

The detailed description set forth below in connection with the appended drawings is intended to provide a description of various exemplary embodiments of additively manufacturing transport structures and is not intended to represent the only embodiments in which the invention may be practiced. The term "exemplary" used throughout this disclosure means "serving as an example, instance, or illustration," and should not necessarily be construed as preferred or advantageous over other embodiments presented in this disclosure. The detailed description includes specific details for the purpose of providing a thorough and complete disclosure that fully conveys the scope of the invention to those skilled in the art. However, the invention may be practiced without these specific details. In some instances, well-known structures and components may be shown in block diagram form, or omitted entirely, in order to avoid obscuring the various concepts presented throughout this disclosure.

This disclosure is generally directed to the assembly of transport structures using AM techniques. In one aspect of the disclosure, AM is used to print the entire frame and body of the vehicle or other transport structure. In addition, the components that make up the transport structure (engine, windshield, lights, etc.) may be integrated into the transport structure as modular components. That is, they may be secured to the vehicle via a number of interconnects, matching perforations, or nut/bolt connections, but they are easily removed from the transport structure and the remaining components when a repair is required, when an update is desired, or when an impact occurs that affects certain components but not others.

As shown below, the combination of the additive manufacturing techniques with the modular properties of the transport structure may be used to add value and efficiency to the transport structures in particular and the manufacturing process in general. In addition, such techniques can provide distinct advantages to a user. These points are addressed in greater detail below.

Manufacturers that stand to benefit from this proposed combination of features include those that manufacture virtually any mechanized form of transport, which often rely heavily on complex and labor intensive machine tools and molding techniques, and whose products often require the development of complex panels, nodes, and interconnects to be integrated with intricate machinery such as combustion engines, transmissions and increasingly sophisticated electronic circuits. Examples of such transport structures include, among others, trucks, trains, boats, aircraft, tractors, motorcycles, busses, trains, and the like.

Additive Manufacturing (3-D Printing).

A variety of different AM techniques have been used to 3-D print components composed of various types of materials. For example, Directed Energy Deposition (DED) AM systems use directed energy sourced from laser or electron beams to melt metal. These systems utilize both powder and wire feeds. The wire feed systems advantageously have higher deposition rates than other prominent AM techniques. Single Pass Jetting (SPJ) combines two powder spreaders and a single print unit to spread metal powder and to print a structure in a single pass with apparently no wasted motion. As another illustration, electron beam additive manufacturing processes use an electron beam to deposit metal via wire feedstock or by sintering on a powder bed in a vacuum chamber. Single Pass Jetting is another exemplary technology claimed by its developers to be much quicker than conventional laser-based systems. Atomic Diffusion Additive Manufacturing (ADAM) is still another recently developed technology in which components are printed, layer-by-layer, using a metal powder in a plastic binder. After printing, plastic binders are removed and the entire part is sintered at once into a desired metal.

One of several AM techniques, as noted, is DMD. FIG. 1 illustrates an exemplary embodiment of certain aspects of a DMD 3-D printer 100. DMD printer 100 uses feed nozzle 102 moving in a predefined direction 120 to propel powder streams 104a and 104b into a laser beam 106, which is directed toward a workpiece 112 that may be supported by a substrate. Feed nozzle may also include mechanisms for streaming a shield gas 116 to protect the welded area from oxygen, water vapor, or other components.

The powdered metal is then fused by the laser 106 in a melt pool region 108, which may then bond to the workpiece 112 as a region of deposited material 110. The dilution area 114 may include a region of the workpiece where the deposited powder is integrated with the local material of the workpiece. The feed nozzle 102 may be supported by a computer numerical controlled (CNC) robot or a gantry, or other computer-controlled mechanism. The feed nozzle 102 may be moved under computer control multiple times along a predetermined direction of the substrate until an initial layer of the deposited material 110 is formed over a desired area of the workpiece 112. The feed nozzle 102 can then scan the region immediately above the prior layer to deposit successive layers until the desired structure is formed. In general, the feed nozzle 102 may be configured to move with respect to all three axes, and in some instances to rotate on its own axis by a predetermined amount.

Figure 2:
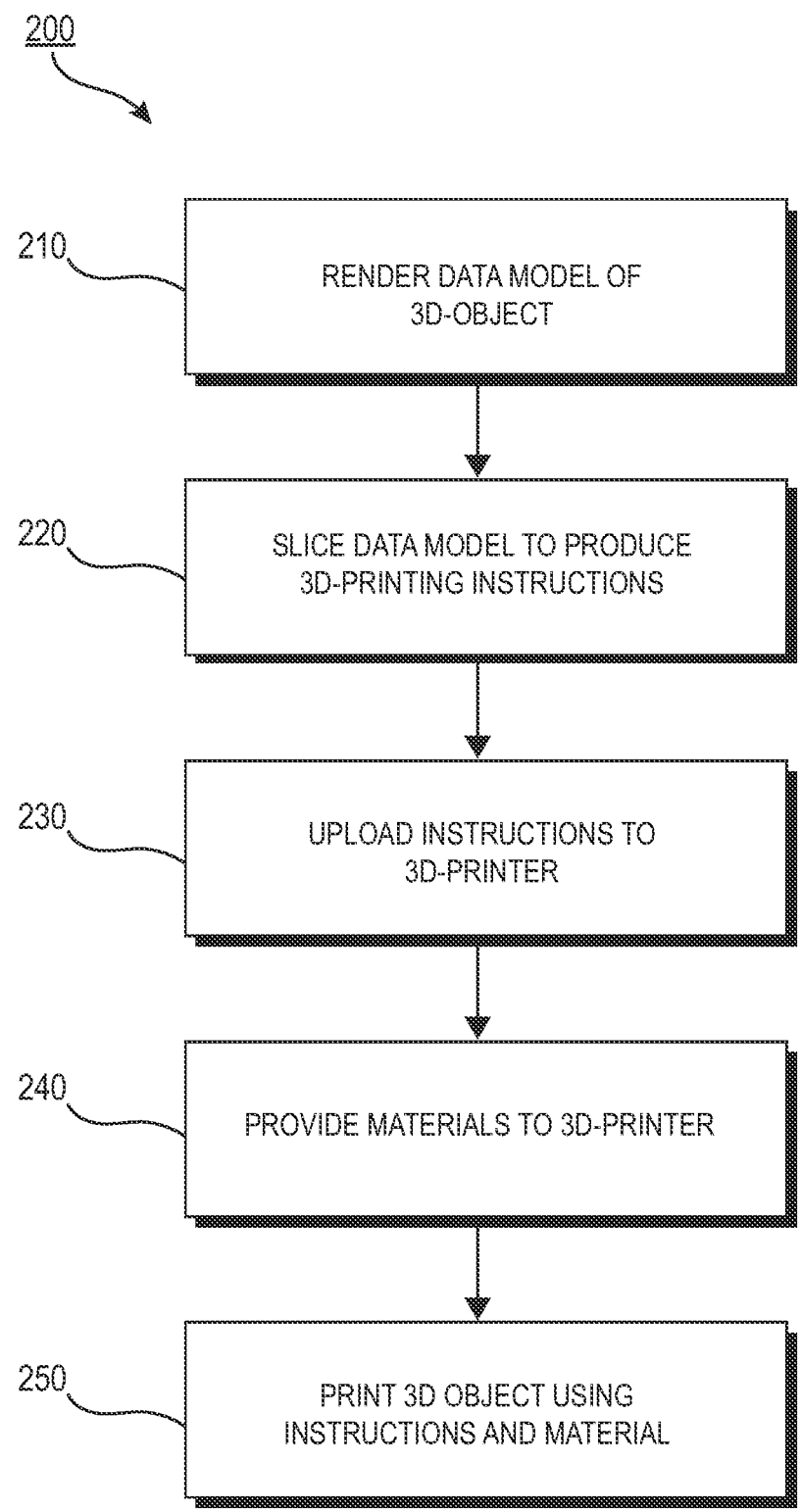
FIG. 2 illustrates a conceptual flow diagram of a process for additively manufacturing an object using a 3-D printer.

FIG. 2 is a flow diagram 200 illustrating an exemplary process of 3-D printing. A data model of the desired 3-D object to be printed is rendered (step 210). A data model is a virtual design of the 3-D object. Thus, the data model may reflect the geometrical and structural features of the 3-D object, as well as its material composition. The data model may be created using a variety of methods, including CAE-based optimization, 3D modeling, photogrammetry software, and camera imaging. CAE-based optimization may include, for example, cloud-based optimization, fatigue analysis, linear or non-linear finite element analysis (FEA), and durability analysis.

3-D modeling software, in turn, may include one of numerous commercially available 3-D modeling software applications. Data models may be rendered using a suitable computer-aided design (CAD) package, for example in an STL format. STL (stereolithography) is one example of a file format associated with commercially available stereolithography-based CAD software. A CAD program may be used to create the data model of the 3-D object as an STL file. Thereupon, the STL file may undergo a process whereby errors in the file are identified and resolved.

Following error resolution, the data model can be "sliced" by a software application known as a slicer to thereby produce a set of instructions for 3-D printing the object, with the instructions being compatible and associated with the particular 3-D printing technology to be utilized (step 220). Numerous slicer programs are commercially available. Generally, the slicer program converts the data model into a series of individual layers representing thin slices (e.g., 100 microns thick) of the object be printed, along with a file containing the printer-specific instructions for 3-D printing these successive individual layers to produce an actual 3-D printed representation of the data model.

The layers associated with 3-D printers and related print instructions need not be planar or identical in thickness. For example, in some embodiments depending on factors like the technical sophistication of the 3-D printing equipment and the specific manufacturing objectives, etc., the layers in a 3-D printed structure may be non-planar and/or may vary in one or more instances with respect to their individual thicknesses. For example, in some exemplary embodiments, a build piece may be additively manufactured using PBF, after which DMD may be applied to change a region of the build piece using a non-flat layer structure and/or layers having different thicknesses.

A common type of file used for this purpose is a G-code file, which is a numerical control programming language that includes instructions for 3-D printing the object. The G-code file, or other file constituting the instructions, is uploaded to the 3-D printer (step 230). Because the file containing these instructions is typically configured to be operable with a specific 3-D printing process, it will be appreciated that many formats of the instruction file are possible depending on the 3-D printing technology used.

In addition to the printing instructions that dictate what and how an object is to be rendered, the appropriate physical materials necessary for use by the 3-D printer in rendering the object are loaded into the 3-D printer using any of several conventional and often printer-specific methods (step 240). In DMD techniques, for example, one or more metal powders may be selected for layering structures with such metals or metal alloys. In selective laser melting (SLM), selective laser sintering (SLS), and other PBF-based AM methods (see below), the materials may be loaded as powders into chambers that feed the powders to a build platform. Depending on the 3-D printer, other techniques for loading printing materials may be used.

The respective data slices of the 3-D object are then printed based on the provided instructions using the material(s) (step 250). In 3-D printers that use laser sintering, a laser scans a powder bed and melts the powder together where structure is desired, and avoids scanning areas where the sliced data indicates that nothing is to be printed. This process may be repeated thousands of times until the desired structure is formed, after which the printed part is removed from a fabricator. In fused deposition modelling, as described above, parts are printed by applying successive layers of model and support materials to a substrate. In general, any suitable 3-D printing technology may be employed for purposes of this disclosure.

Another AM technique includes powder-bed fusion ("PBF"). Like DMD, PBF creates 'build pieces' layer-by-layer. Each layer or 'slice' is formed by depositing a layer of powder and exposing portions of the powder to an energy beam. The energy beam is applied to melt areas of the powder layer that coincide with the cross-section of the build piece in the layer. The melted powder cools and fuses to form a slice of the build piece. The process can be repeated to form the next slice of the build piece, and so on. Each layer is deposited on top of the previous layer. The resulting structure is a build piece assembled slice-by-slice from the ground up.

FIGS. 3A-D illustrate respective side views of an exemplary PBF system 300 during different stages of operation. As noted above, the particular embodiment illustrated in FIGS. 3A-D is one of many suitable examples of a PBF system employing principles of this disclosure. It should also be noted that elements of FIGS. 3A-D and the other figures in this disclosure are not necessarily drawn to scale, but may be drawn larger or smaller for the purpose of better illustration of concepts described herein. PBF system 300 can include a depositor 301 that can deposit each layer of metal powder, an energy beam source 303 that can generate an energy beam, a deflector 305 that can apply the energy beam to fuse the powder, and a build plate 307 that can support one or more build pieces, such as a build piece 309. PBF system 300 can also include a build floor 311 positioned within a powder bed receptacle. The walls of the powder bed receptacle 312 generally define the boundaries of the powder bed receptacle, which is sandwiched between the walls 312 from the side and abuts a portion of the build floor 311 below. Build floor 311 can progressively lower build plate 307 so that depositor 301 can deposit a next layer. The entire mechanism may reside in a chamber 313 that can enclose the other components, thereby protecting the equipment, enabling atmospheric and temperature regulation and mitigating contamination risks. Depositor 301 can include a hopper 315 that contains a powder 317, such as a metal powder, and a leveler 319 that can level the top of each layer of deposited powder.

Figure 3A:
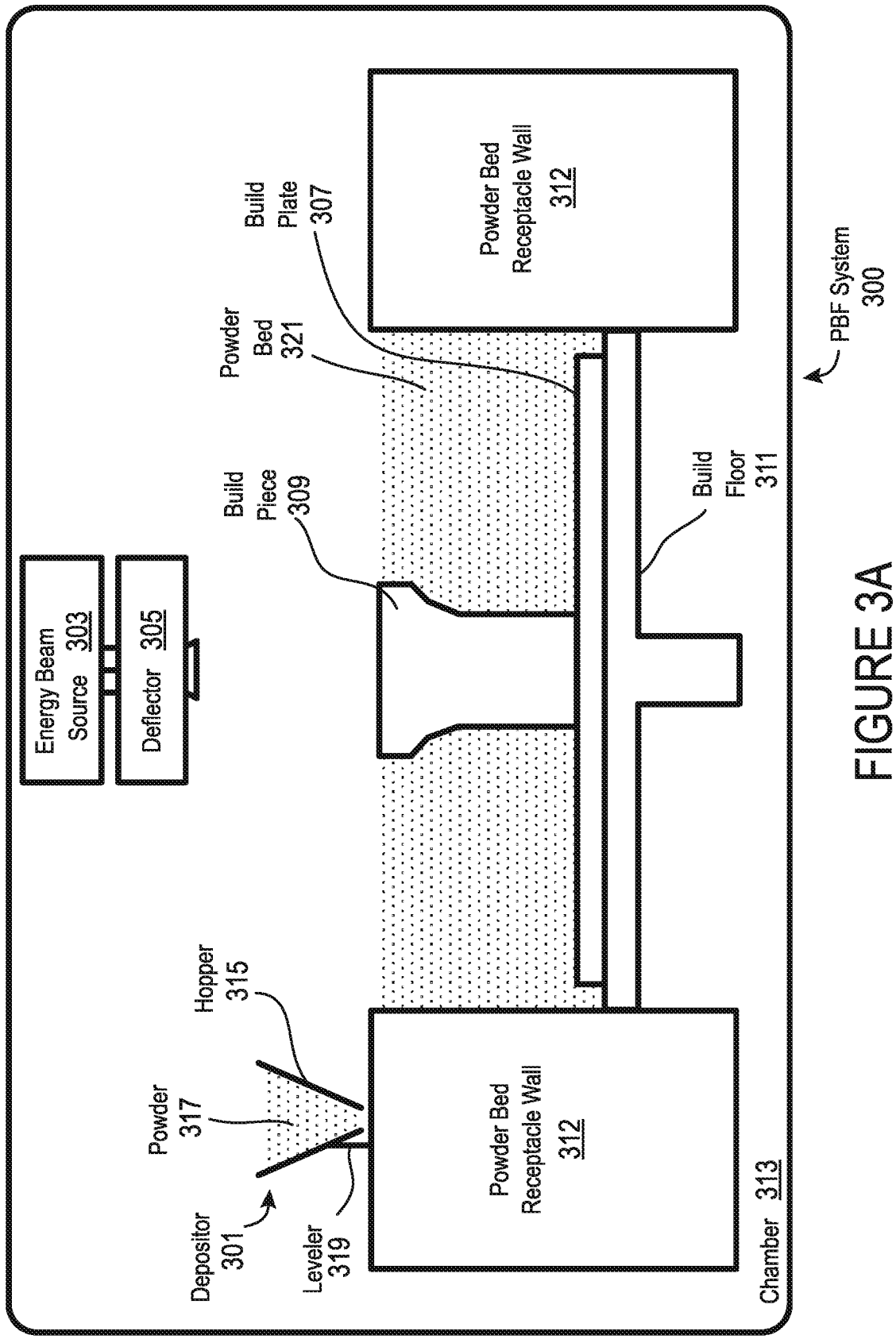
FIGS. 3A-D illustrate an example powder bed fusion (PBF) system during different stages of operation.

Referring specifically to FIG. 3A, this figure shows PBF system 300 after a slice of build piece 309 has been fused, but before the next layer of powder has been deposited. In fact, FIG. 3A illustrates a time at which PBF system 300 has already deposited and fused slices in multiple layers, e.g., 150 layers, to form the current state of build piece 309, e.g., formed of 150 slices. The multiple layers already deposited have created a powder bed 321, which includes powder that was deposited but not fused.

Figure 3B:
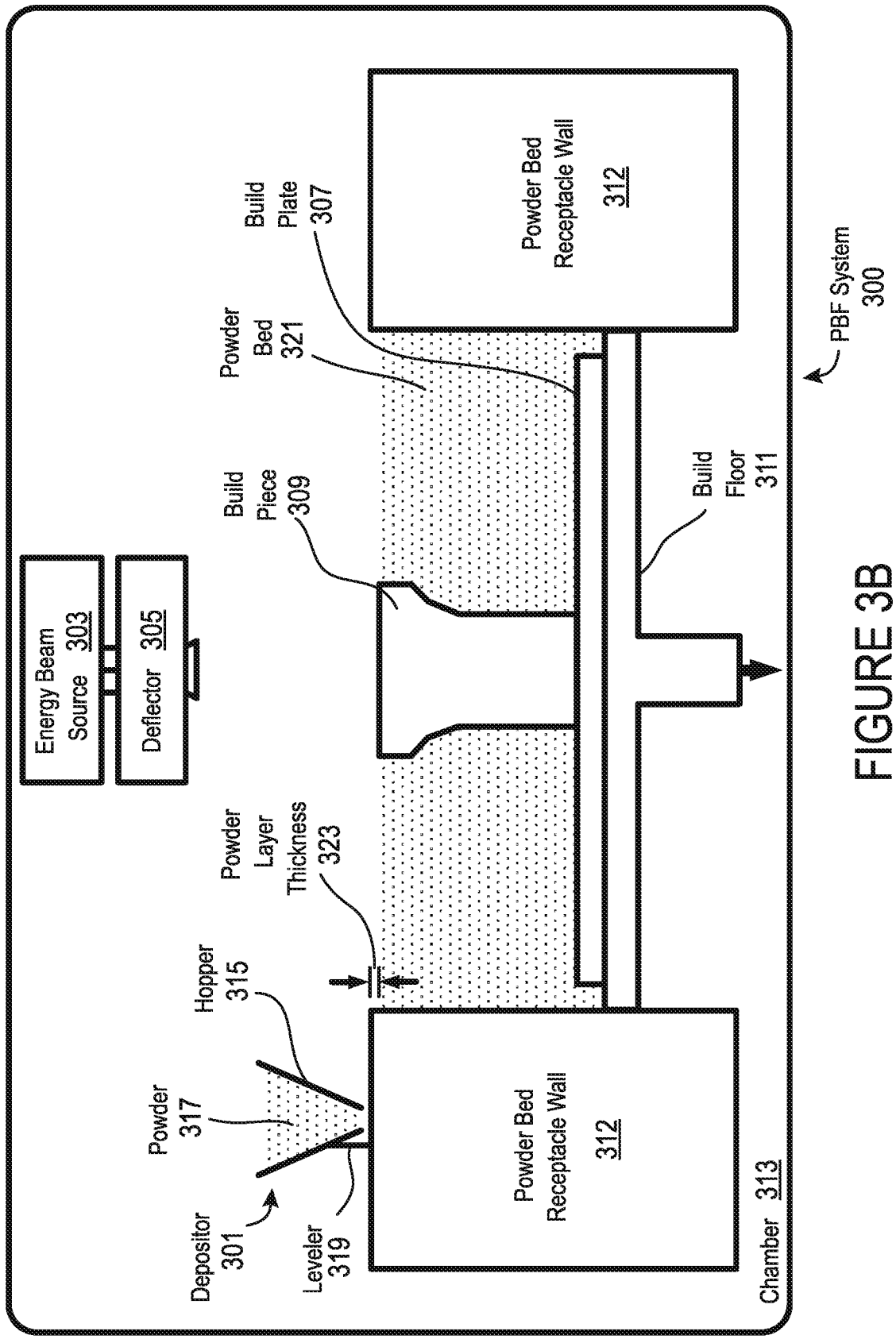

FIG. 3B shows PBF system 300 at a stage in which build floor 311 can lower by a powder layer thickness 323. The lowering of build floor 311 causes build piece 309 and powder bed 321 to drop by powder layer thickness 323, so that the top of the build piece and powder bed are lower than the top of powder bed receptacle wall 312 by an amount equal to the powder layer thickness. In this way, for example, a space with a consistent thickness equal to powder layer thickness 323 can be created over the tops of build piece 309 and powder bed 321.

Figure 3C:
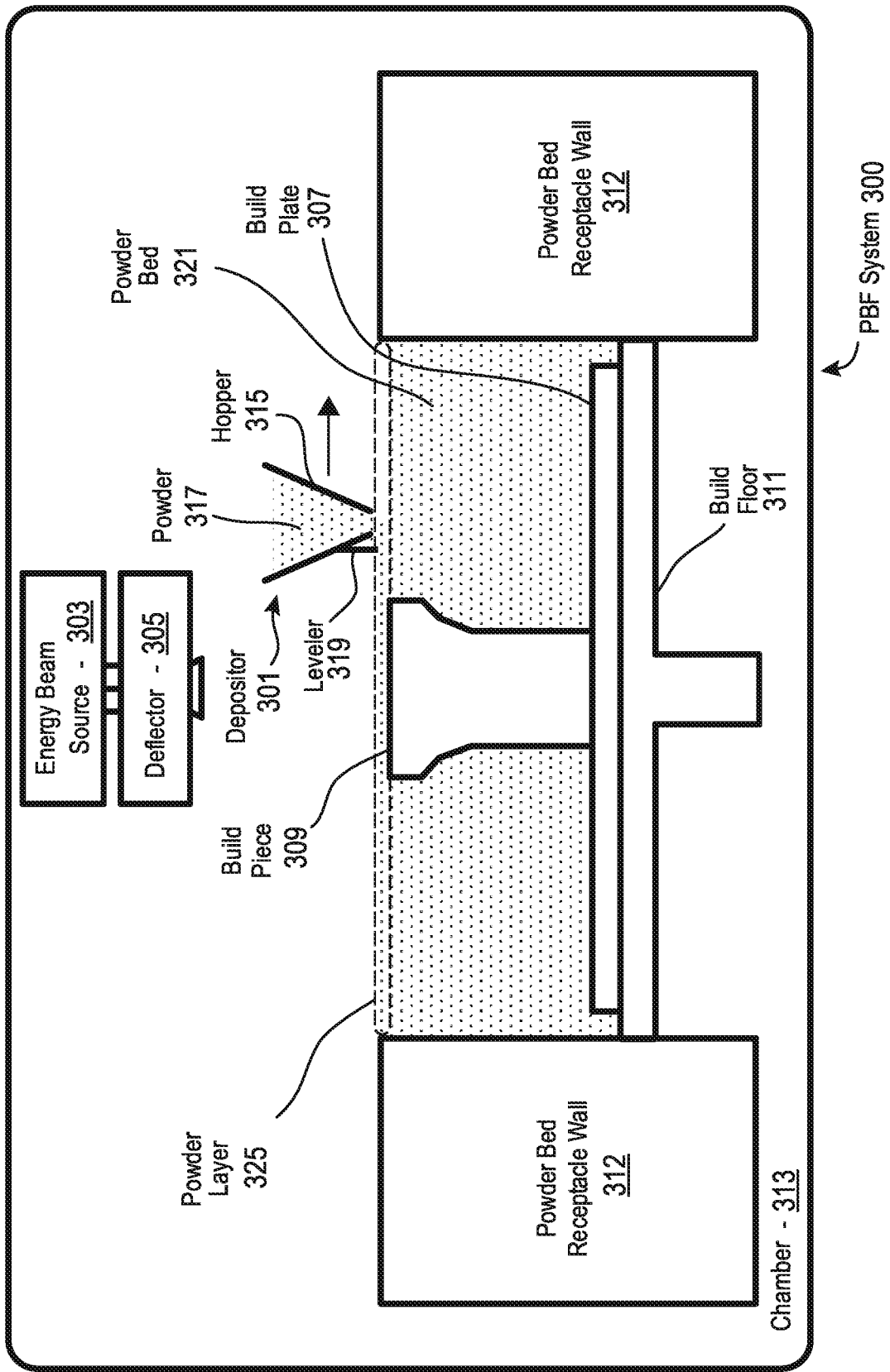

FIG. 3C shows PBF system 300 at a stage in which depositor 301 is positioned to deposit powder 317 in a space created over the top surfaces of build piece 309 and powder bed 321 and bounded by powder bed receptacle walls 312. In this example, depositor 301 progressively moves over the defined space while releasing powder 317 from hopper 315. Leveler 319 can level the released powder to form a powder layer 325 that has a thickness substantially equal to the powder layer thickness 323 (see FIG. 3B). Thus, the powder in a PBF system can be supported by a powder support structure, which can include, for example, a build plate 307, a build floor 311, a build piece 309, walls 312, and the like. It should be noted that the illustrated thickness of powder layer 325 (i.e., powder layer thickness 323 (FIG. 3B)) is greater than an actual thickness used for the example involving 350 previously-deposited layers discussed above with reference to FIG. 3A.

Figure 3D:
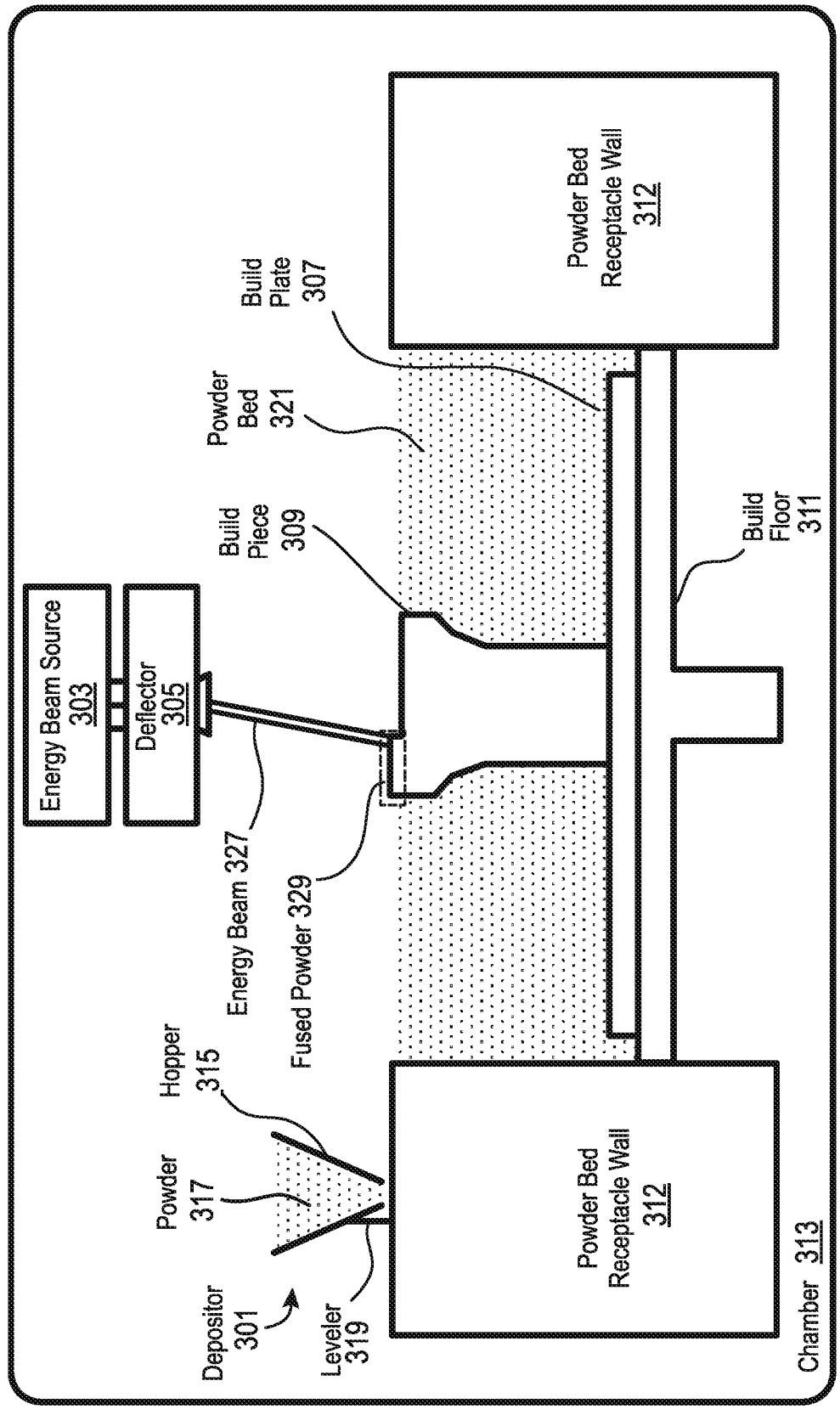

FIG. 3D shows PBF system 300 at a stage in which, following the deposition of powder layer 325 (FIG. 3C), energy beam source 303 generates an energy beam 327 and deflector 305 applies the energy beam to fuse the next slice in build piece 309. In various exemplary embodiments, energy beam source 303 can be an electron beam source, in which case energy beam 327 constitutes an electron beam. Deflector 305 can include deflection plates that can generate an electric field or a magnetic field that selectively deflects the electron beam to cause the electron beam to scan across areas designated to be fused. In various embodiments, energy beam source 303 can be a laser, in which case energy beam 327 is a laser beam. Deflector 305 can include an optical system that uses reflection and/or refraction to manipulate the laser beam to scan selected areas to be fused.

In various embodiments, the deflector 305 can include one or more gimbals and actuators that can rotate and/or translate the energy beam source to position the energy beam. In various embodiments, energy beam source 303 and/or deflector 305 can modulate the energy beam, e.g., turn the energy beam on and off as the deflector scans so that the energy beam is applied only in the appropriate areas of the powder layer. For example, in various embodiments, the energy beam can be modulated by a digital signal processor (DSP).

Multi-Aspect Printing.

To streamline the manufacturing process and maximize efficiency in accordance with an aspect of the disclosure, multi-aspect printing is used. It may be desirable or necessary in many cases to produce components using a plurality of manufacturing processes. Conventionally, to accomplish this result, different dedicated machines are used. Thus, for example, a panel may be produced in part using DMD or PBF-based AM techniques, and then portions of the panel may undergo a finishing technique using FDM or spray forming processes. Additionally, subtractive manufacturing processes may also be necessary, for example, to remove unwanted materials from the 3-D printed panel or to further define features within a component.

In this conventional situation, the component must be transported between different dedicated machines for undergoing the plurality of different processes. The use of different machines can be time consuming and inefficient, and can add costs to the manufacturing of parts. These costs can increase substantially as production capacity increases.

In an aspect, these distinct functions may be combined into a single multi-aspect machine. In one exemplary embodiment, a single multi-aspect printer (MAP) includes two or more AM features. In other embodiments, the machine may include various subtractive manufacturing (SM) functions. For example, the MAP may incorporate functions performed by a CNC machine. MAP may include a robotic arm coupled to a tool for cutting material from a component on a substrate. The arm may alternatively be configured to receive one of a plurality of tools operable for performing different SM procedures.

The integration of multiple technologies into a single machine can substantially increase manufacturing speed and capacity, while reducing costs of labor otherwise incurred from moving the components and capital used for purchasing dedicated AM machines. Additionally, the combined functionality enables components to be printed in series or in parallel, increasing design flexibility and further maximizing production efficiency. Generally, the AM and SM operations of the MAP may be performed in any order.

MAP may include a single printer having a single print area using multiple print heads, including one or more DMD print heads, operable to print multiple areas simultaneously. MAP may be used to achieve greater versatility and speed in printing 3-D structures. MAP has the capability to set up and implement local PBF processing. MAP may also additively manufacture custom build plates needed for AM operations. In some embodiments, MAP can use DMD to produce "build plate supports" that attach to the printer plates and that support the attached build plate. These build plate supports may be attached below the build plate and can be made to be breakable from the build plate to enable the build plate to become part of the printed structure, if desired.

MAP may further include a robotic arm that introduces a build plate where needed in regions requiring the feature sizes and properties available with PBF. MAP may include another robotic arm that may be used to introduce a build plate where needed locally in a larger chamber. A robotic coating arm may then coat the build plate and subsequent layers between sintering operations. MAP may further include a vacuum arm for removing excess powder upon completion of operations, allowing DMD onto PBF regions.

In one exemplary embodiment, the print heads may be printed in place by DMD. In another embodiment, MAP may incorporate fused deposition modeling (FDM) print capability including FDM extruders which heat and eject melted filament materials provided from FDM spools for printing thermoplastics and other materials ideal for internal supports and other functions where plastics may be beneficial.

Figure 4:
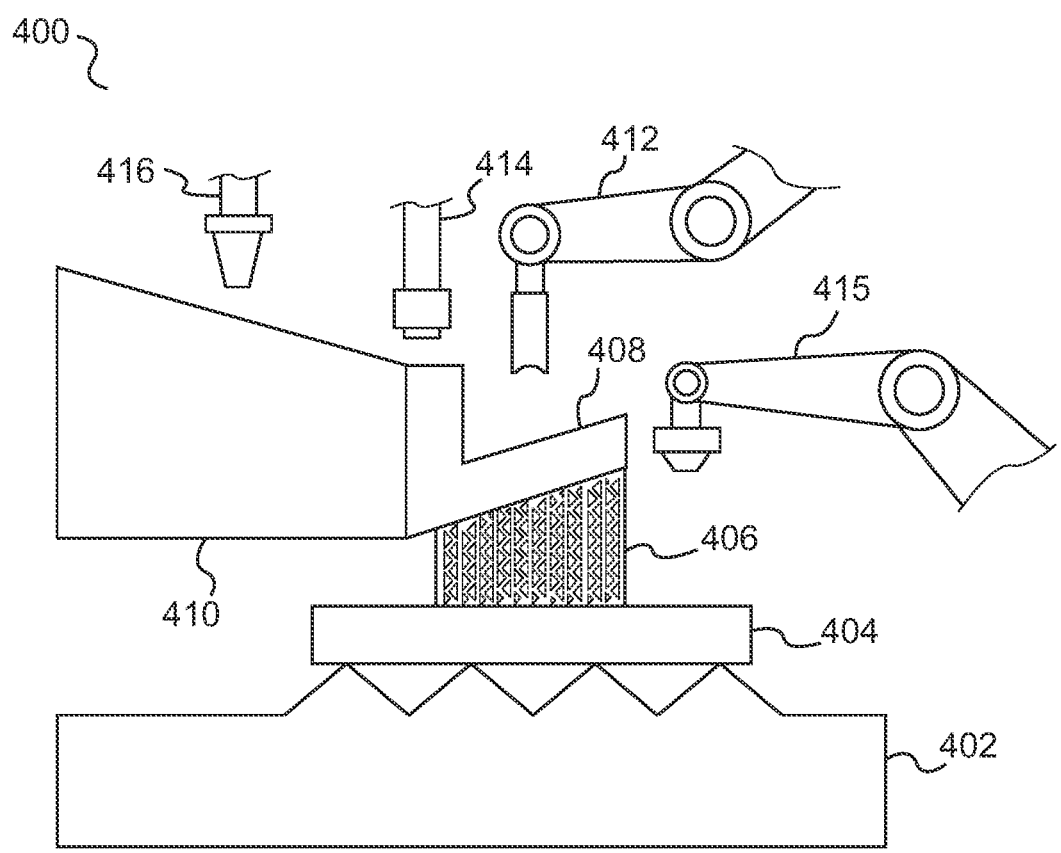
FIG. 4 illustrates a conceptual view of a multi-aspect printer (MAP) in accordance with an aspect of the disclosure.

FIG. 4 illustrates a conceptual view of a multi-aspect printer (MAP) 400 in accordance with an aspect of the disclosure. Referring to FIG. 4, MAP may include, as noted, one or more DMD heads or applicators 416 on a robotic arm assembly for 3-D printing a DMD structure. MAP may further include PBF equipment such as electron or laser beam sources. For example, PBF laser 414 is shown disposed on a separate robotic arm assembly. The PBF equipment may further include deflectors (not shown), a local powder applicator 412 on another robotic arm assembly, and an FDM robotic arm assembly 415. As noted above, in other embodiments more than one print head or applicator may be included on a robotic arm. Alternatively or additionally, more than one robotic arm may include a print head supporting the same technology (e.g., DMD, PBF, FDM, etc.) There may also be a number of different types of PBF technologies employed on one or more robotic arm assemblies (e.g., SLS, SLM, etc.).

One or more of the applicators and robotic arm assemblies of FIG. 4 may be performing operations on a structure which in the embodiment shown includes a PBF structure 408 upon which a larger DMD structure 410 has been formed. The PBF structure 408 may be connected to FDM- and PBF-formed support structure 406 for supporting the PBF structure 408 and DMD structure 410. The PBF structure 408, in turn, is arranged on a local DMD build plate sub-structure 404 which is further supported by a larger DMD build plate support structure 402.

MAP may also include one or more tools for milling. MAP may also use FDM on the top layers of a build piece for surface finishing. Structures for facilitating SM techniques may also be provided, such as automated milling tools and the like.

In some embodiments, MAP may print a structure using DMD and, concurrently or subsequently, add a part with a build plate and an immobile supporting structure. Alternatively, MAP may 3-D print the build plate and then apply a robotic arm containing powder to implement a PBF process while having a laser positioned over the powder bed. The laser may point to a mirror or deflector, which can be mobile or stationary.

MAP can have wide applicability to the manufacture of transport structures and other mechanical assemblies. For example, MAP can print lattice panels located in non-crushable areas using PBF or FDM (in the case of plastic lattice panels). MAP can print metal vehicle panels using DMD. MAP can also use FDM to 3-D print support features. In the case of a curved panel, for example, FDM may be needed to print the corresponding lattice structures for supporting the panel. As noted above, FDM can also be used to provide surface finishing to increase quality of the 3-D printed parts. In other embodiments, MAP can 3-D print support materials using a combination of FDM and PBF technologies. These supports can optionally be broken off following the AM process on the object being printed.

In another exemplary embodiment, MAP may include spray form capability. Spray forming is the inert gas atomization of a liquid metal stream into variously sized droplets (10-500 microns) that are then propelled away from the region of atomization by the fast flowing atomizing gas. The droplet trajectories are interrupted by a substrate which collects and solidifies the droplets into a coherent, near fully dense preform. By continuous movement of the substrate relative to the atomizer, large preforms can be produced in a variety of geometries including billets, tubes and strip. The addition of a robotic arm for spray forming provides yet additional versatility to MAP.

Further, as described above, MAP may incorporate one or more SM processes. For example, MAP may include a CNC computer controlled arm for use in accurately removing material or structure where needed.

In addition, MAP may include multiple arms and/or print heads for performing the same AM functions in a faster manner. For instance, MAP may provide a plurality of DMD print heads for performing metal deposition in parallel, or more than one energy beam for implementing multiple PBF processes.

The availability of multiple robotic arms performing unique functions also enables other AM processes to be conducted in parallel. For example, in manufacturing a panel, one section of the panel may be undergoing PBF processing while another section to which PBF techniques have already been applied may simultaneously undergo spray forming. Parts may also be 3-D printed in series, with one process immediately following another without delays associated with mobilizing the component to another printer or another production area.

MAP may be under the general control of a central processing system, controller or computer that executes instructions corresponding to each of MAP's different capabilities. The processing system may be operable to integrate this code together to provide a meaningful sequence of instructions that incorporate a plurality of MAP's capabilities into one overall manufacturing operation. In other embodiments where desired, MAP may include a number of modes for using individual AM or SM technologies. For example, MAP can be used in FDM printing mode to additively manufacture a plurality of exclusively FDM-based objects. To accomplish this objective, the processing system may, in general, include a variety of processing modes whereby different capabilities of MAP are exploited for specific applications. These modes may also include specific modes that utilize a plurality of MAP's features concurrently, where desired for efficiency or as an inherently-desired aspect of rendering a particular object.

The capability to additively manufacture parts enables the manufacturer to generate shapes, configurations, and structures that are not available in conventional manufacturing processes. Further, advances in AM technologies are expected to continue. Print speed is continually increasing. 3-D printer form factor has also seen regular advances. This means, among other things, that the area of the build platform as compared with the size of the component to be printed is becoming progressively larger. Advances in build plates and printer profiles may continue to cross unprecedented boundaries in size, speed and sophistication. The availability and suitability of candidate materials and chemical compounds for use as base material in creating AM structures is likewise increasing. In sum, the versatility of AM may continue to beneficially impact the manufacture of sophisticated mechanized assemblies such as the vehicles described herein.

Modularity.

In some exemplary embodiments, the design and manufacture of the transport structure may be modular in nature. Modular vehicles are those that are assembled by joining multiple discrete systems together to form one vehicle. Unlike conventional vehicles, modular vehicles provide the freedom of customizability. Complex parts and consoles can be removed easily, both for functional and aesthetic purposes, and new parts and consoles can be added in a straightforward manner. Because AM technologies not tooling intensive, AM can be used to facilitate the development of modular systems by efficiently fabricating a variety of customized designs that maintain pace with customer requirements and demand.

AM also provides modularity processes with the capability to define and build complex and efficient interfacing features that define partitions or borders between modules. These features can include indentations, tongue and groove techniques, adhesives, nuts/bolts, and the like. A further advantage of implementing a modular design for vehicles is ease of repair. Modular designs ensures easy access to virtually any component in the vehicle. In the event of a crash, the affected modular block simply can be replaced. The block(s) can also be co-printed with the remaining structure to save assembly time. The blocks can even incorporate in-situ scanning and observation to ensure accurate joining and repair of the modules.

Modular design of vehicles can be considered in some limited respects like Lego blocks. Additive manufacturing technologies provide customers with the opportunity to customize virtually every block. For the installation of a higher performance powertrain, the old one is removed and the new powertrain is installed by connecting it at the appropriate interfaces to the rest of the vehicle. Exterior panels may be easily changed as well, which in turn provides the ability to change the overall appearance of the vehicle.

Vehicle manufacturing and operation can become extremely efficient using the above-described modular techniques. Users may keep their vehicles for a longer time, since they have the option of customizing vehicle appearance, systems and performance at any point. The backbone of the vehicle may remain the same, while new systems replace old ones. Interior consoles can just be extracted from the vehicle to make room for new, advanced consoles to be plugged in. The mounts for these consoles would be 3-D printed, and it would be easy to match the connection ports with the modules.

The modules that are replaced or damaged can be recycled to recover raw material for use in the AM process. Because entire parts are additively manufactured, there is minimal loss of material during the recycling process. The recycled material makes its way into the 3-D printers to manufacture newly-minted parts. These types of capabilities in recycling substantially all of an old part may significantly increase the efficiency and flexibility of corresponding relevant facets of the auto industry.

Using a modular design approach, the AM vehicle may be assembled as a collection of 3-D printed and non-printed components integrated together via some interconnection means for attaching the components at defined borders or transitions as noted above. Individual components may be added and removed without requiring changes to other components of the vehicle. Using a modular approach, the vehicle may be considered as a replaceable collection of assembled parts connectable into a functional transport structure via standard interconnects.

Modularity as described herein includes embodiments where the vehicle frame (e.g., the endoskeleton), body, and integrated components may be co-printed, where the co-printed parts making up the vehicle may further constitute an arrangement of smaller substructures. Assembling a vehicle in which the pieces are modular in nature provides numerous additional advantages. As noted above, the frame and other portions of the vehicle may be defined by a plurality of constituent parts coupled together using one or more interconnect features. Such interconnect features may include nuts and bolts, screws, clamps, snap-in engagements, or other mechanical attachment mechanisms. The modular components may also include perforations, depressions for accommodating drilling, tongue-and-groove connections or other male-female interconnects, and reattachment mechanisms defined by bolt holes. In some cases adhesives may be desirable. The structure, including the frame, may be co-printed in a manner that can enable separation and recovery of the constituent modular parts.

In another embodiment, the entire frame of the vehicle (and optionally other parts integrated within the frame) may be printed in a single pass or in a few renderings. Smaller parts of the frame may be printed if the frame is further subdivided into smaller modules. Such a modular frame structure, in certain embodiments, can make it easier to access parts of the vehicle underneath the frame.

The modular approach described herein provides a number of advantages over existing approaches. A non-exhaustive list of such advantage may include, in summary:

1. Design and Manufacturing simplification. The entire process of designing and manufacturing transport structures can be simplified and streamlined using AM techniques coupled with modular designs. Generally, the cost and time associated with 3-D printing the vehicle and its constituent components, and integrating and assembling the components into the vehicle, are far less than those associated with conventional machining processes involving largely customized designs and dedicated manufacturing infrastructures (e.g., assembly lines dedicated exclusively to producing individual models of transport structures).

2. Integration of printed versus non-printed components. 3-D printing the vehicle in modular sections also allows the manufacturer to define transitions between printed components and any non-printed components during the design process. The vehicle can then be assembled using these transitions such that non-printed components may treated as modular segments like the printed components. This facilitates the ease of later repair and replacement procedures affecting individual components, including non-printed components within the vehicle.

3. Availability of simple to complex components. Manufacturing approaches that produce parts primarily through conventional machining and tooling techniques are limited by the allowable complexity of components, especially for a given price range. Conventionally, vehicular components based on sophisticated designs require use of custom molds and added manufacturing steps, which can increase cost. Using 3-D printing techniques, complex and sophisticated shapes that are otherwise impractical or impossible to produce using conventional machining techniques may be achieved easily and in a cost effective manner using modular designs and additive manufacturing. Further, the complexity and sophistication of overall designs may be broken down into individual components that can be managed more easily than for larger components covering a variety of functions.

4. Interchangeability of components. After the vehicles are sold, parts may be upgraded to incorporate newer features or added functionality. Regardless of the complexity of the component, the use of AM enables the component upgrades to be produced in a straightforward manner and easily assembled into the vehicle by removing the old component and assembling into place the new component using standard interconnect mechanisms. In some embodiments, the assembly of the new components may be made simple using "snap in" techniques or other interconnects designed specifically for ease of interchangeability. The combination of replaceable components that have standard interconnections (including interconnections available for electrical conduits, fluid transfer, and other complex features) facilitates ease of interchangeability. A user of the vehicle may acquire upgrades to the vehicle without having to incur expenses for labor associated with custom interconnections and significant alterations to other, unrelated parts of the vehicle.

5. Ease of repair. The modular design of the vehicle simplifies repairs for parts degraded due to wear and tear or damaged in an impact event. Conventionally, when a vehicle is involved in a collision affecting a certain subset of components, the repair process requires the replacement of additional components beyond the affected components. These replacements for otherwise unaffected components, such as vehicle panels and node sections, drive up repair costs. This is because in conventional vehicles lacking modular features, individual components are often constructed as a single large and inseparable component incorporating a variety of potentially unrelated features. In other instances, these individual components are often linked to adjacent components in a manner requiring all such components to be replaced wholesale if any one of the individual components is damaged. For example, if a single side panel is compromised during an accident involving a conventional, non-modular vehicle, adjacent panels that are inseparable from the damaged side panel may also have to be replaced. Using modular designs, by contrast, only the side panel that was affected need be replaced, leaving adjacent panels unaffected. In sum, if one module of the vehicle gets damaged, a replacement module can be provided, and the vehicle repaired, simply by replacing the damaged module with a new part.

6. Outdated or discontinued components. In the manufacturing industry, parts may become outdated and obsolete. This may substantially limit the options for a vehicle owner requiring an obsolete part to effectuate a repair process. If the part is no longer produced, especially as in the case with custom vehicles or less popular models, the part may need to be re-manufactured from whole cloth using traditional tooling. By contrast, the modular nature of the transport structures described herein means that outdated or obsolete components, however sophisticated or unique, can simply be 3-D printed based on the original CAD data model. The part can then be assembled into the vehicle.

7. Upgrades: changing look and feel. Beyond the repair and replacement process for damaged or affected parts as described above, modularity more generally provides ease of customization of the vehicle for the owner. This customization includes changing the look of the vehicle. Existing multi-panel assemblies can, in one embodiment, be replaced wholesale with newer AM structures. Newer and more modern panels can be constructed and assembled via simple interconnects to replace older panels. Such panels and related structures can have designs that range from trivial to sophisticated and complex. Regardless of the complexity of the underlying parts, modularity enables potentially significant changes to the vehicle's appearance at a manageable cost.

In addition to aesthetics, an owner may elect to increase performance of the vehicle by replacing the engine or other such parts. The capability of AM together with use of modular components as applied to the engine, transmission, drivetrain, and other performance-related structures facilitates the ease of performance upgrades in much the same manner as upgrades for aesthetic purposes.

In short, using the AM capabilities and modular construction techniques as described, 3-D printed vehicular components can be easily manufactured, and later reprinted and replaced as necessary. Repair and replacement is made possible for parts regardless of their complexity or of their current availability in inventory. Custom modular panels and other parts having a unique shape may be manufactured and assembled into an AM vehicle. Unlike conventional techniques in which adjacent parts of the automobile need to be replaced as well if one part is damaged during an impact, the parts to be replaced using the techniques herein may be limited to those that were affected by the impact.

It will be appreciated that in other embodiments, panels and other parts having modular features are not limited to being 3-D printed, but may also be constructed using other techniques, including the use of tooling or molding techniques, or other non-AM techniques, where necessary or desirable. Conversely, it will be appreciated that in still other embodiments involving specific conditions or manufacturing criteria, certain AM parts need not be defined by modular features.

In one aspect of the disclosure, complete transport structures are additively manufactured. For the purposes of this disclosure, AM techniques using vehicles are used to demonstrate the capabilities of these advanced manufacturing techniques. However, using substantially similar principles as outlined in this disclosure, practitioners skilled in the art will recognize that the technology described herein can extend with equal force to other classes of transport structures—planes, trains, busses, boats, snowmobiles, motorcycles, and aircraft to name only a few.

In an exemplary embodiment, the transport structure may include a set of general components. In an exemplary embodiment, the set of general components may include components that are integrated in part or in whole within the frame. In an embodiment, the set of general components, for example, may include a subset of components that are internal to the frame or that are in partially or fully exterior to the frame and otherwise coupled to the frame. In some embodiments, the set of general components may also include components that are not necessarily integrated within the frame but that are attached or appended, directly or indirectly, to the frame or the body. Further, in other exemplary embodiments, at least a portion of the set of general components may comprise modular components.

The frame may include a plurality of cavities for housing components that use an external interface. In an exemplary embodiment, the set of general components may include a subset of components that use an external interface.

Nosecone Structure.

Figure 5:
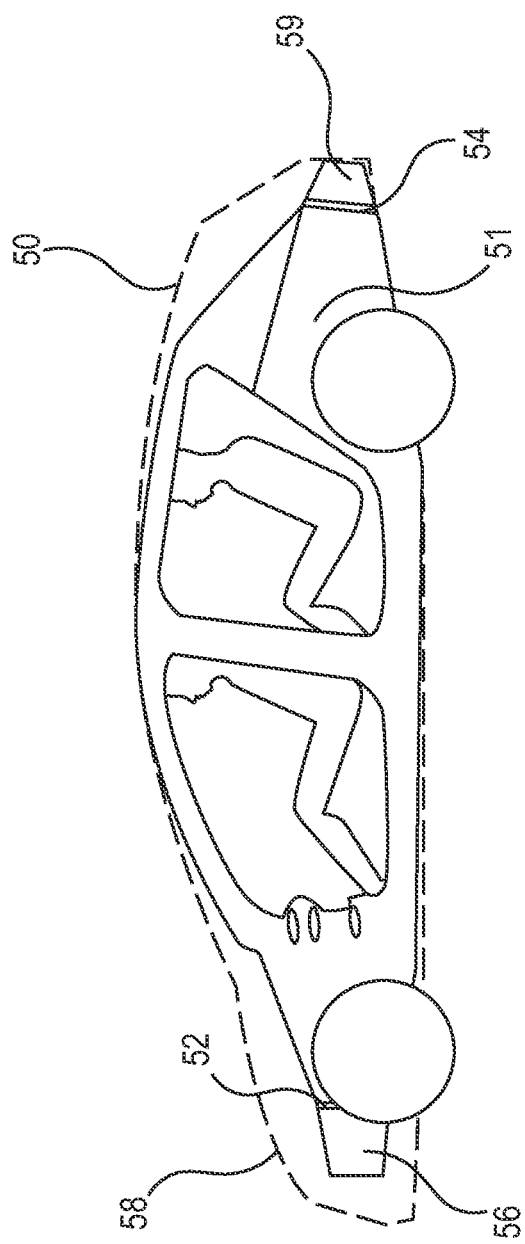
FIG. 5 illustrates a side view of a vehicle additively manufactured (AM) having an endoskeleton frame in accordance with the concepts disclosed herein.

FIG. 5 illustrates a side view of an vehicle additively manufactured (AM) having an endoskeleton frame in accordance with the concepts disclosed herein. Endoskeleton frames are the internal support structures that sit under the body of the transport structures. In one aspect of the disclosure, the entire transport—frame and body—may be additively manufactured. Depending on the size of the build plate and geometry of the 3-D printer, the frame and body are either additively manufactured in modules, or in a single rendering. The main difference between this category of transports and exoskeleton-based transports is that in endoskeleton transports, the frame is substantially 'covered' by another material (the body).

FIG. 5 shows, more specifically, an example of an endoskeleton transport 50 with a nosecone structure. Nosecone structures allow the freedom for including multiple optimized safety features for absorbing impact. The entire structure can be designed in a way such that the nosecone is the only section that sustains damage during an impact event. The nosecone may thereafter be simply removed after the collision and easily replaced. The transport 50 includes an endoskeleton 51 with a front surface 52 and a rear surface 54. In an exemplary embodiment, a front nosecone structure 56 is 3-D printed flush against the front surface 52 of the endoskeleton frame 51. A rear nosecone structure 59 is 3-D printed flush against the rear surface 54 of the endoskeleton frame 41. As shown by outlines 58 and 50, the nosecones 56, 59 can be covered using a foam or lattice structure which can branch into the cabin for structural support. One advantage of using AM in this configuration is that the reinforcing structures of this part may be printed solid (e.g., the nosecone), while the other parts such as the body 58, 50 may be printed with lattices covered with panels for weight savings. In addition to being 3-D printed, such panels may be molded, laser cut, or manufactured using other conventional techniques.

In one embodiment, the feet of the driver can nest within the nose structure. The nose structure, in turn, can mate with a hinge post platform with interfacing centers. This design advantageously provides the ability to place the pedals directly on the floor. In an exemplary embodiment, the pedal assembly is 3-D printed in such a way that the cockpit remains in front of the pedals.

In another embodiment, the 3-D printed nose structure (e.g., nosecone 56) can also transition into a metal exterior body. In this embodiment, the hinge post bulges into spots behind the vehicle door. The structure can transition from inside to outside as the transport moves from nosecone to exterior. FIG. 6A illustrates a perspective view of a vehicle having a nosecone and a metal body in accordance with the concepts disclosed herein. In this configuration, a front impact beam 68 is mounted on a nosecone 66, the collection of which replaces the need for frame rails on the transport structure. Like in FIG. 5, a body including foam or lattice can be placed between the elements (such as, for example, between impact beam 68 and along the surfaces of nosecone 66 up to a base of the windshield 60). Further, at approximately an intersection of dashed lines 62 and 63, an inner structure of the body below the nosecone 66 can mount to a front suspension. In the rear (not shown), the body can also be mounted directly to the rear suspension.

FIG. 6B shows a side view of the transport structure of FIG. 6A. Notably, the driver's feet can rest on a surface 67 of nosecone structure 66. The occupants' opening can use integrated door hinges. The rear style exterior shell 69 can extend farther back for further occupant protection for impact events as well as to accommodate greater storage capacity.

Safety Cell Transport.

In another aspect of the disclosure, a safety cell is additively manufactured. The safety cell is a reliable endoskeleton structure that helps prevent the transfer of energy to the occupants of the vehicle during an impact event. In an exemplary embodiment, the safety cell is 3-D printed to include a crumple zone at either end and a compact cage-like space in the occupant compartment. In an impact event from the front, the front end is crushed and as such, absorbs as much of the inertial energy as possible. The same applies to the rear end in an impact event from the back. The crumple zones help decelerate the transport structure during the impact. The safety cell may also be made from a strong material that can withstand such impact events, such as steel or another durable metallic material.

A safety cell design makes safety of the vehicle occupants its first order of priority, by preventing transfer of the load to the occupants during the impact event as discussed above. In an embodiment, the safety cell may be made as compact as possible to accommodate advanced packaging features in the overall vehicle design. In an embodiment, the safety cell endoskeleton would be covered by a body made of foam. In other embodiments, AM metal or plastic could also act as a body covering the safety cell. Usage of lattice structure would result in appreciable weight reduction.

Figure 7:
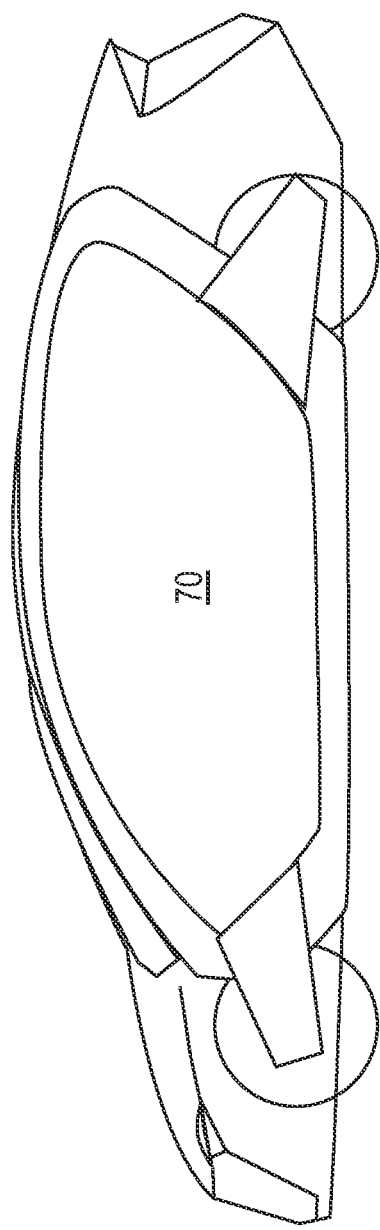
FIG. 7 shows an illustration of a safety cell architecture used in an endoskeleton-type transport.

FIG. 7 shows an illustration of a safety cell architecture used in an endoskeleton-type transport. As shown in the embodiment of FIG. 7, the safety cell 70 is additively manufactured to be as small as possible so that additional packaging features can be included. Since the safety cell 70 constitutes the principal load bearing device, a minimum-size safety cell may enable a designer to provide a diverse array of different type and different sized body types. In the example of FIG. 7, a wide variety of options for the size and shape of the body type can be selected to package safety cell 70. For example, the body can extend further out at both the front and the rear of the transport. The suspension can also be situated to position the wheels differently. In an embodiment, the safety cell may be 3-D printed in one or a few passes, and different modules may be 3-D printed (or co-printed with the safety cell). In some embodiments, the small size of the safety cell 70 enables it to be 3-D printed using a minimum number of renderings, down to a single one. Lattice material can also be printed outside the safety cell and underneath the panels to provide a lightweight vehicle.

Additive Manufacturing of Components.

In another aspect of the disclosure, a plurality of components of the transport structure are additively manufactured and assembled into the frame to produce an integrated, modular transport system. Examples of common components in transport structures include joints. Vehicles and other transports typically include a significant number of joints. Collections of joint members can be simultaneously co-printed to achieve optimal efficiency. Additive manufacturing of these members provides greater design freedom to extract maximum efficiency from the performance of these joints as they enable design driven performance unlike any other conventional technology.

Living hinges can also be additively manufactured. One such example includes the hinges between the control arm and body structure of the vehicle. In automotive suspension, a control arm is a hinged suspension link between the chassis and the suspension upright or hub that carries the wheel. The inboard (chassis) end of a control arm may be attached by a single pivot, usually a rubber bushing. The position of the outboard end of the control arm can only be controlled in a single degree of freedom, maintaining the radial distance from the inboard mount. Although not deliberately free to move, the single bushing does not control the arm from moving back and forth; this motion is constrained by a separate link or radius rod.

Most control arms form the lower link of a suspension. A few designs use them as the upper link, usually with a lower wishbone. The additional radius rod is then attached to the upper arm. The control arm can be co-printed with the body structure with a nominal gap. The nominal gap can then be filled with rubber or another type of elastomer for providing the desired spring and rotational characteristics.

Figure 8:
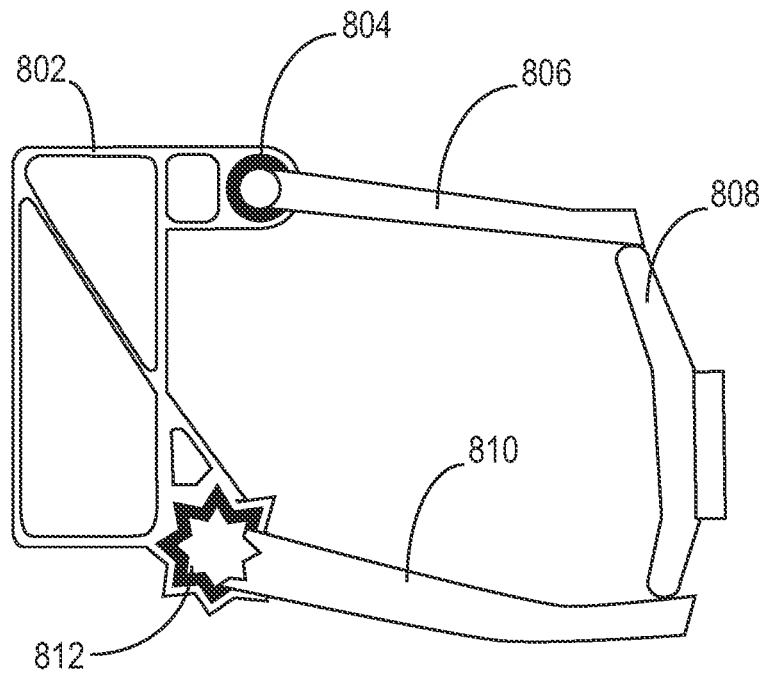
FIG. 8 shows a 3-D printed member including a body structure, upper control arm, lower control arm and other portions of a 3-D printed aluminum assembly.

FIG. 8 shows a front view of an exemplary control arm configuration. Referring to FIG. 8, body structure 802, upper control arm 806 and lower control arm 808 all include sections of the 3-D printed aluminum assembly. The upper and lower control arms 806 and 810 are connected via upright 808 on one side. Upper control arm 806 may be connected on the other side to a polymer bushing 804. The polymer bushing 804 may provide positional stability with limited rotation and vibration isolation. Lower control arm 810 is in this embodiment connected to a larger star-shaped polymer bushing 812, which may provide positional stability, spring rotation and vibration isolation. The rubber bushing used in elements 804 and 812 may be molded in place via injection of molten rubber material into the cavity. In another exemplary embodiment, the rubber/elastomer can be 3-D printed instead. Alternatively, feeder tubes used to inject rubber/elastomer can be 3-D printed with the rest of the structure.

Figure 9:
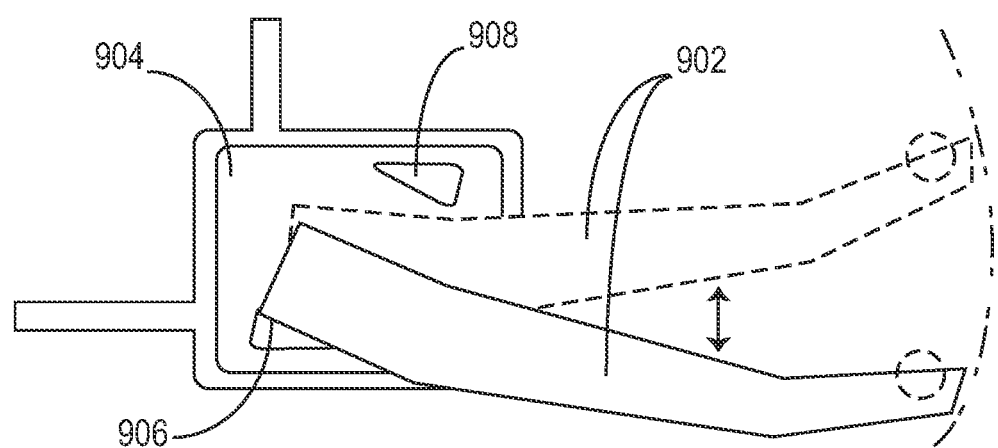
FIG. 9 shows an illustration of control arm moving between two different positions using a geometrically diverse nominal gap to effect different physical characteristics.

FIG. 9 shows an illustration of control arm 902 rotating between two different positions using a geometrically diverse nominal gap in an exemplary embodiment. The composition of the area defined by element 904 includes the rubber/elastomer material. As shown by the rectangular shape of element 904, shapes may generally vary to affect spring and rotation characteristics. In addition, components 906 and 908 may constitute fluid or gas filled cavities which may be incorporated into the rubber/elastomer material to affect spring rate.

Another example of 3-D co-printing includes printing the housing for the electric motor with the control arm. Co-printing these components can enable the design of superior propulsion systems for vehicles, which are only possible through AM. The electric motor can also be mounted on the center of mass of the control arm, as shown with reference to FIG. 9.

Figure 10:
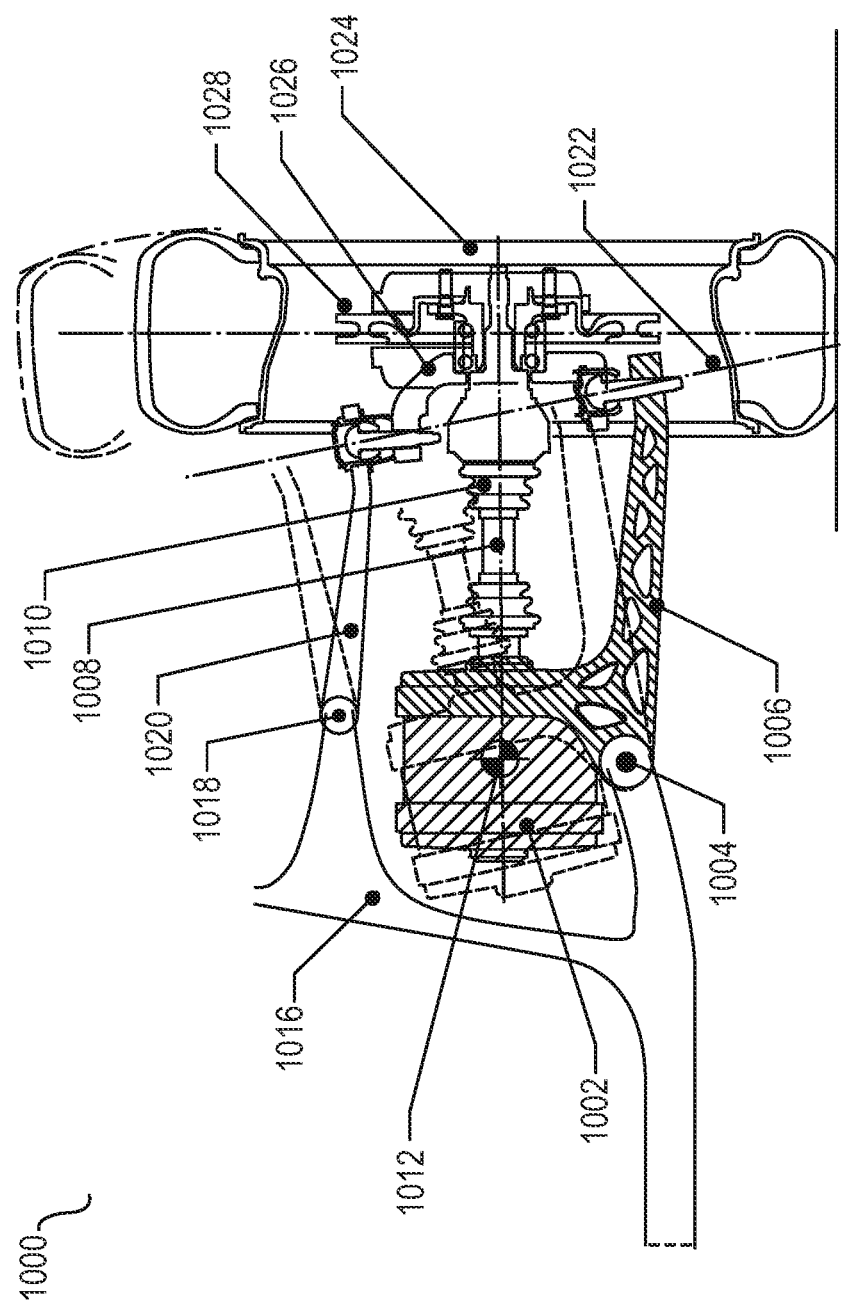
FIG. 10 illustrates a short long arm (SLA) suspension geometry with an electric motor mounted to the lower control arm at the pivot axis.

FIG. 10 illustrates a short long arm (SLA) suspension geometry 1000 with an electric motor 1002 mounted to the lower control arm 1006 at the pivot axis 1004. Conventionally, in electric powered vehicles, the motors are often located at the center of the front or rear axles. In some cases, the motors are incorporated into the wheel hubs. In the example of FIG. 10, the electric motor 1002 is mounted close to the lower control arm pivot 1004 and rocks with the suspension system as it travels into jounce and rebound. Although there is some inertia involved, the increase in unsprung mass is minimal as compared to a hub motor because the motor travel is minimized. A key advantage to this concept, therefore, is that it provides package efficiency without negatively affecting vehicle handling. The motor 1002 is connected to the drive wheel hub via a short drive shaft 1008 with constant velocity (CV) joints 1010 to accommodate any angular changes between the wheel hub and the control arm/motor. The motor housing can be additively manufactured together with the lower control arm 1006 to create a full optimized housing. The motor housing may include the features discussed above as well as the motor's center of mass 1012, the vehicle structure/suspension cradle 1016, the upper pivot 1018, the upper control arm 1020, the steering axis 1022, control arm 1024, upright 10926, and brake rotor 1028.

Figure 11:
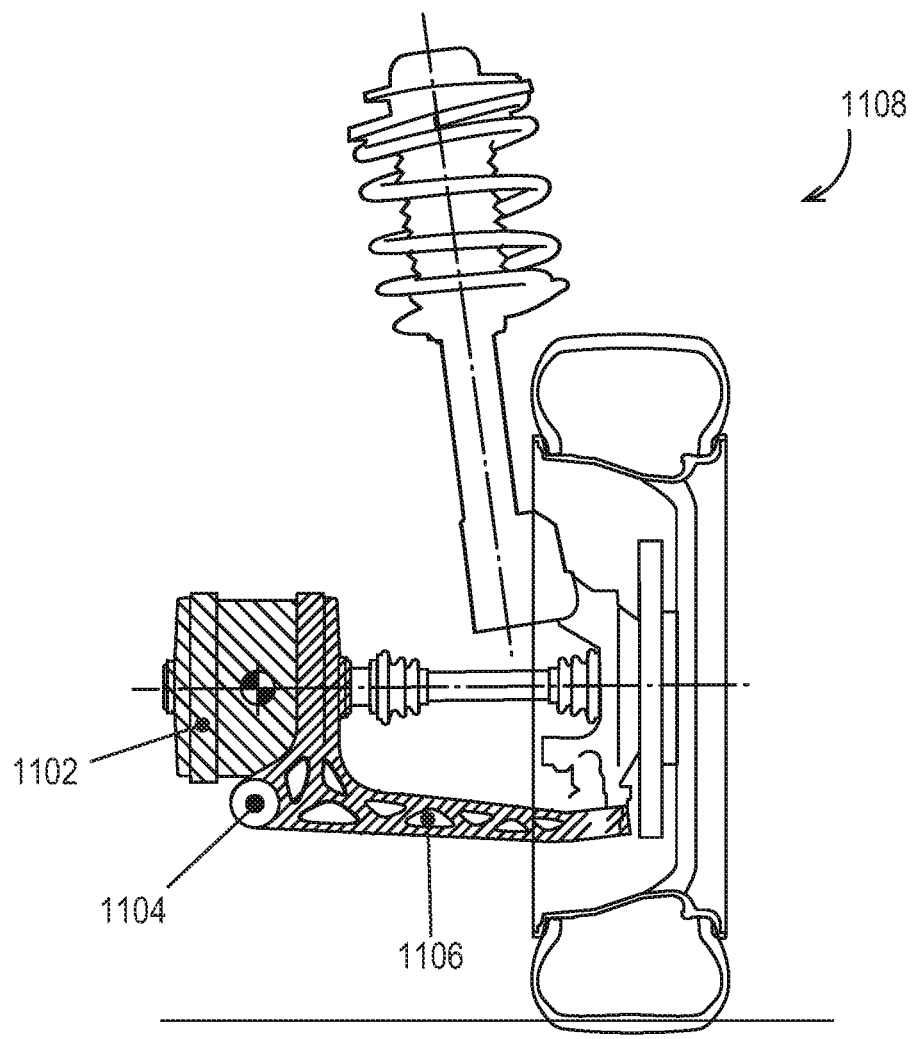
FIG. 11 illustrates an example of a McPherson strut type suspension coupled to an electric motor mounted to the lower control arm at a pivot point.

FIG. 11 illustrates a McPherson strut type suspension 1108 with an electric motor 1102 mounted to the lower control arm 1106 at the pivot axis 1104. It should be noted that this control arm mounted motor system will work with any suspension system in which the control arm pivot is perpendicular to the wheel rotation axis. In an exemplary embodiment, one or more of these parts may be additively manufactured an included as a modular component in the vehicle frame.

Figure 12A:
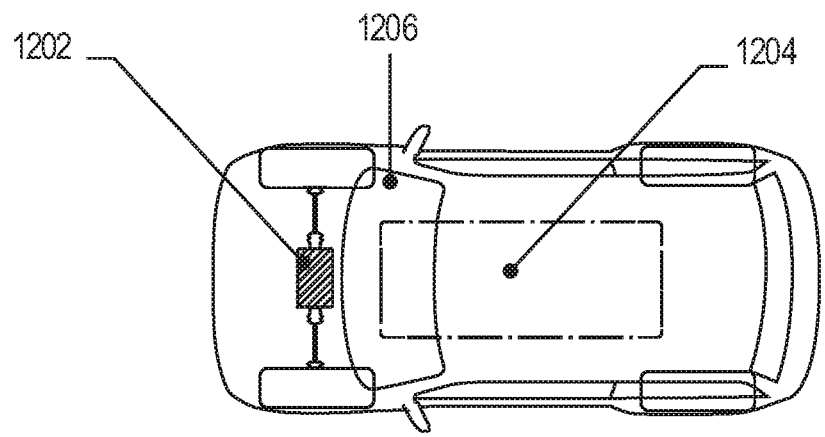
FIGS. 12A-C illustrate different embodiments of a vehicle with the electric motor mounted in different configurations.
Figure 12B:
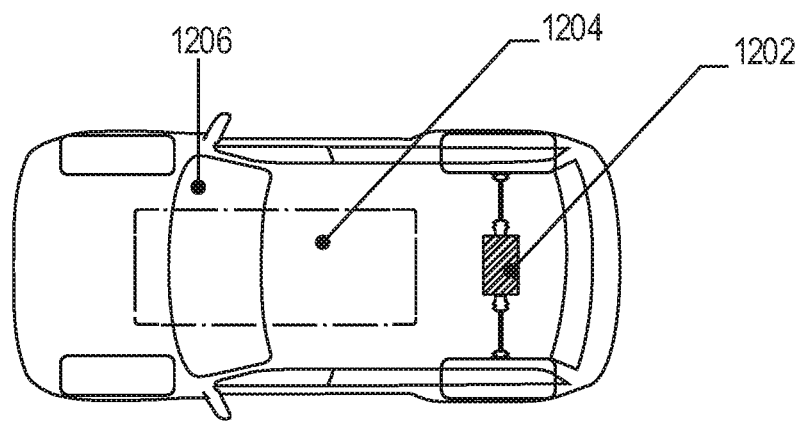
Figure 12C:
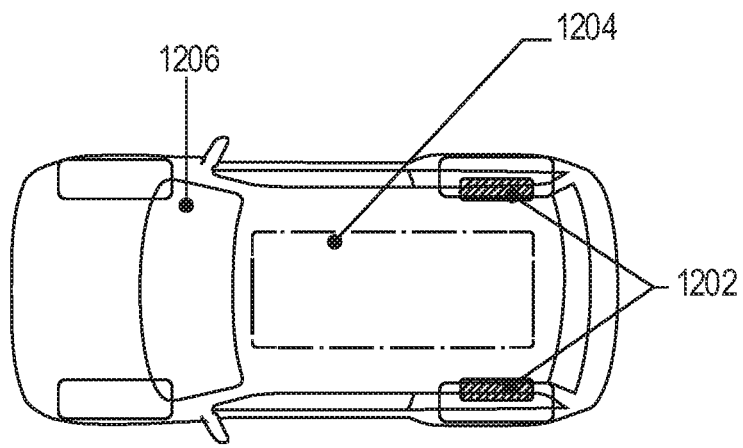

FIGS. 12A-C illustrate different embodiments of a vehicle with the electric motor mounted in different configurations. In FIG. 12A, the electric motor 1202 is mounted at the center of the front axle in the front crush space. In FIG. 12B, the electric motor 1202 is mounted at the center of the rear axle in the rear cargo area. In the case of FIGS. 12A and 12B, the motors occupy valuable cargo or seating space and because the motors do not crush under impact, they also require additional crush space to added to the front (FIG. 12A) or rear (FIG. 12B) of the vehicle. FIG. 12C represents an embodiment where the hub electric motors 1202 are mounted efficiently at the rear wheel, but they add unsprung mass to the wheel, which may have a negative effect on the wheel's handling. For FIGS. 12A-C, the battery pack and electrical components are placed in area 1204, and the windshield is shown as 1206.

In another exemplary embodiment, interface centers can be provided at predetermined regions of the vehicle while being manufactured. These regions can serve as joints between two or more sections of the vehicle that fail during a crash. The repairs on the vehicle are effected simply by removing the damaged section and 3-D printing a new one with the remaining part of the vehicle. This approach is in contrast to the conventional approach where not only the damaged structure is replaced, but the surrounding parts as well. This novel approach also makes recycling of damaged parts much easier.

Interior Structural Components.

Figure 13:
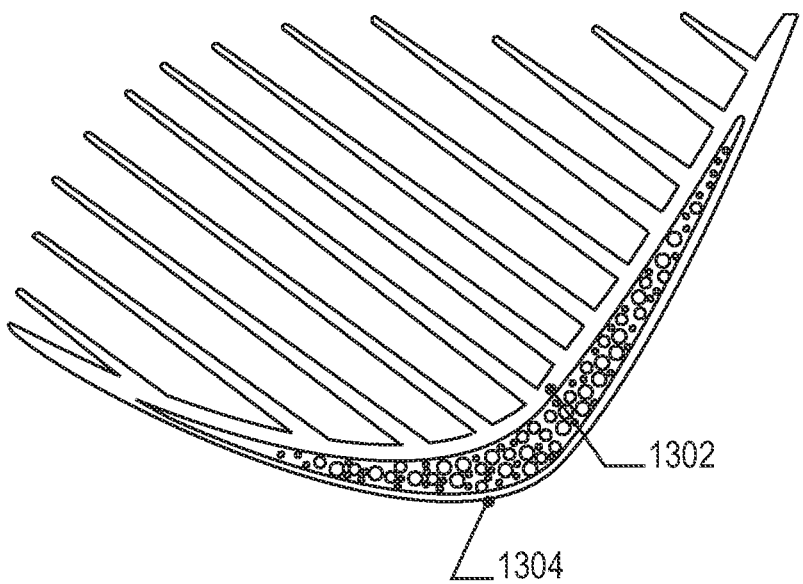
FIG. 13 show an additively manufactured structural interior trim that can be added in places where head impact protection is required.

Interior structural components can be produced through AM using modular techniques. For example, FIG. 13 shows an AM structural interior trim that can be added in places where head impact protection is required. The trim may be supported by rigid structure 1302 from where the prongs of the trim emanate. By contrast, element 1304 may be placed adjacent the likely position of the head of an occupant when an impact occurs. Element 1304 may be head injury criterion (HIC) compliant.

Figure 14:
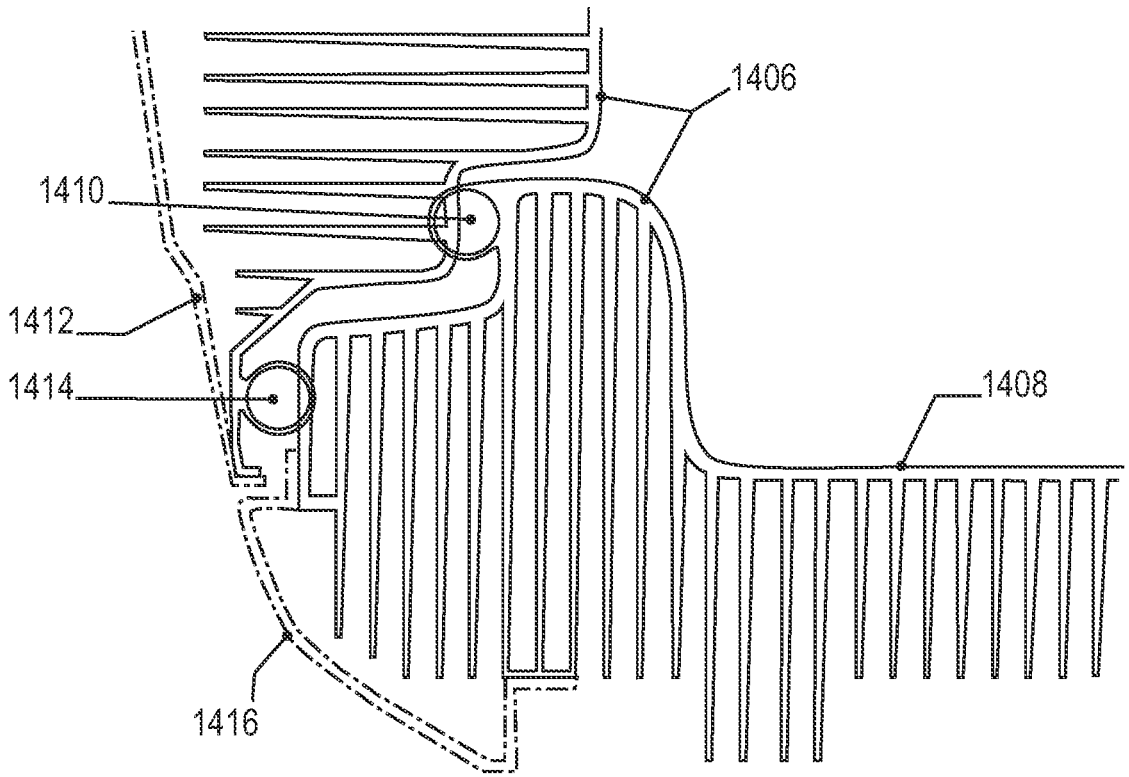
FIG. 14 shows an additively manufactured structural interior trim with exterior panels added for aerodynamics, aesthetics and pedestrian protection.

FIG. 14 shows an additively manufactured structural interior trim with exterior panels added for aerodynamics, aesthetics and pedestrian protection. The trim in one embodiment includes a single piece "cage". The trim may include structural interior panels 1406 for the door, sill and floor. The trim further includes a floor 1408. Seals 1410 and 1414 may be used to seal the interior structural panels 1406 to the floor 1408. The interior trim may be bordered by exterior sill panel 1416 and exterior door panel 1412, which may be part of a separate component set from the single-piece interior trim.

Modular Dash Structures.

Instrument panels and firewalls constitute some of the most complex areas of a vehicle. Typical dash structures have numerous parts and require complex fixturing. Using AM and modular designs, the dash can be optimized to reduce total part count and lower fixturing needs. Moreover, AM can enable lightweight yet durable materials to be 3-D printed, which may result in significant cost savings. Among other advantages, this approach can create significant opportunities for OEMs to increase production of diverse dash assemblies and to enable the OEM to produce multiple variations of the assemblies while reducing capital expenditure.

In an aspect of the disclosure, a 3-D printed mega dash is disclosed. The 3-D printed mega-dash according to an exemplary embodiment may replace numerous individual stampings such as the dash, upper and lower cowl, strut towers, upper load path beams, and cowl sides. A pillar lowers outers, hinges, reinforcements and brackets. Further, the 3-D printed mega dash concept can easily be implemented into a traditional Body-in-White (BIW) build strategy.

Figure 15:
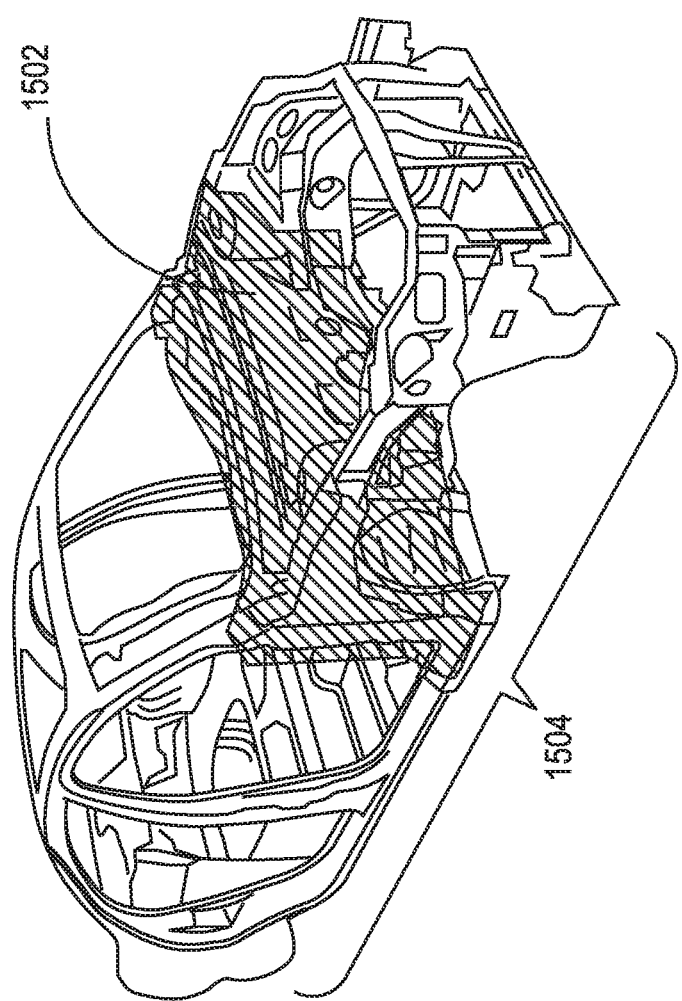
FIG. 15 is a perspective overview of an additively manufactured dash assembled into a vehicle frame.

FIG. 15 is a perspective overview of an additively manufactured mega-dash 1502 assembled into a vehicle frame 1504. As can be seen, the dash 1502 can be co-printed with the frame or it can be 3-D printed and added to the frame afterwards.

Currently, the dash assemblies include significant flexibility, and are at the heart of any platform-derivative strategy. The dimensional range of derivative vehicles using alternative dashboards is currently severely restricted in view of the massive investment in tooling, fixturing, and real estate.

Figure 16:
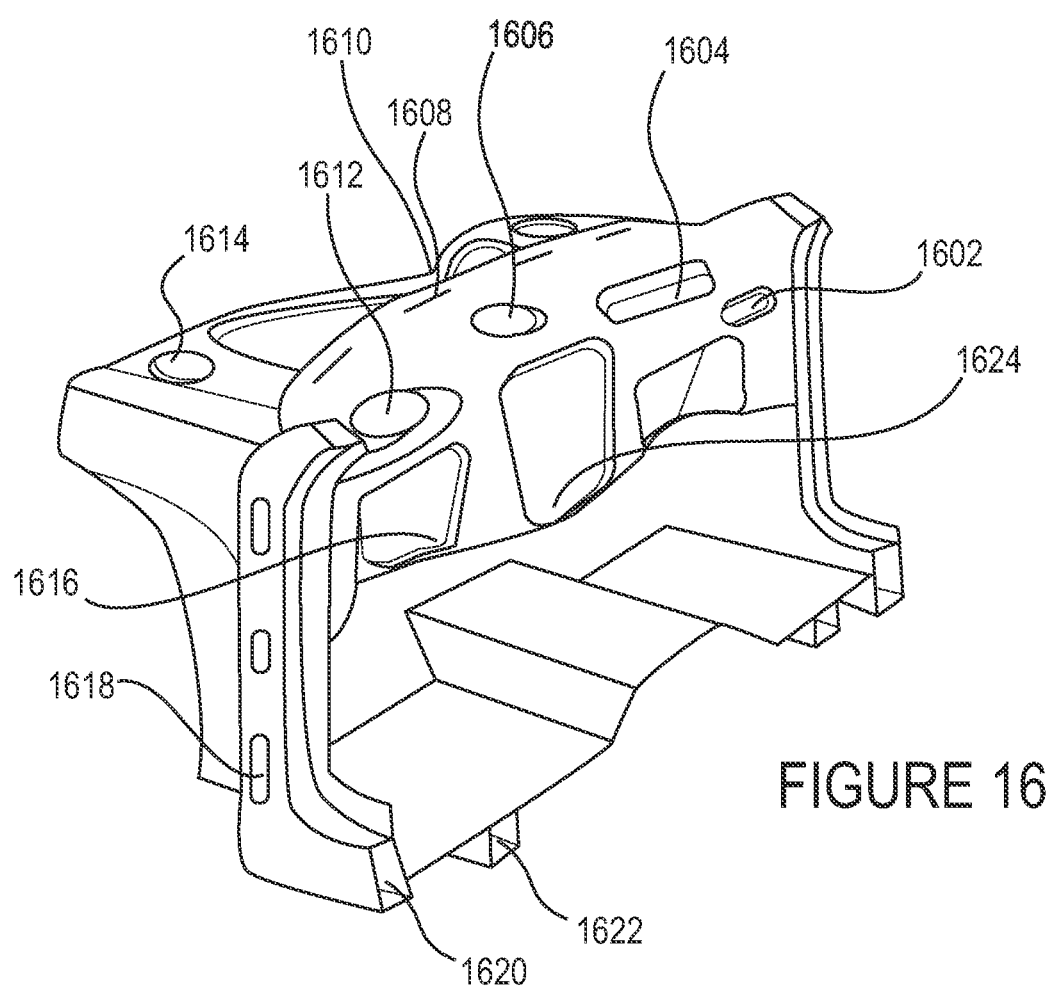
FIG. 16 is a perspective view of a 3-D printed dash.

In contrast to conventional technologies, the AM mega-dash structure can be fully optimized for attachment of all key components that fit within the dash. The AM dash structure can be configured to include apertures and/or mounts for the various components of the assembly. FIG. 16 is a perspective view of a 3-D printed dash. The 3-D printed dash includes fittings for all key components. These include outboard vent aperture 1602, passenger airbag aperture 1604, speaker aperture 1606, defroster ducts 1608, cross brace 1610, cluster aperture 1612, strut mounting 1614, steering column mounting 1616, hinges 1618, sill section with seal flange 1620, rail 1622 and center stack aperture 1624. In one embodiment, the HVAC unit may be mounted on the front side of the dash.

The AM dash can also be optimized to assist the occupant in impact events. In particular, the AM dash may be designed in a manner such that a majority of the frontal impact forces may be transferred into the underbody structure rather than the dash itself. Such a design protects the occupant's head and other vital organ areas. Further, the AM dash may be appended to interior safety items including, for example, a steering column, knee blockers, pedals and airbags, The latter are mounted to the cross car section which is attached to a pillar/cowl side. The steering column can be made to give way in the event of a head strike.

Safety Advances and Autonomous Vehicles.

Auto experts expect vehicle crashes to reduce in frequency over the next several years. This prediction is due in large part to the advances in autonomous/assisted driving technologies. As these technologies mature, active safety may enable further mass optimization of transport structures. The vehicles can in such case be made considerably lighter and can operate with greater efficiency. The ability to concentrate on other design considerations can in turn lead to advances in the overall design of vehicles of the transportation system in general. For example, automated vehicles may potentially result in a significant reduction in traffic congestion. More vehicles can be accommodated on roads due to the precise automation of movement and the automated coordination between vehicles. These vehicles can be made to move more smoothly as automated vehicle systems tirelessly monitor conditions and execute necessary instructions to prevent crashes from occurring. Furthermore, increased active safety may also enable vehicle structural technologies to result in more environmentally-friendly transport structures. This in turn may curb down on emissions and pollutants, and the AM nature of transports would enable the transportation industry to become more eco-friendly.

Hydrogen Vehicles.

In another aspect of the disclosure, an advanced vehicle system is configured to enable hydrogen to be utilized relatively safely as a fuel. The major advantage of hydrogen is that it is a clean fuel as its product after combustion is water. However, hydrogen storage and transport is not easy and gives rise to many safety considerations. For one, hydrogen is highly flammable. Currently, hydrogen vehicles function using fuel cells. These cells generate electricity via the combustion of hydrogen and charge one or more batteries. The stored electrical energy, like any electric car, is thereupon converted into kinetic energy for moving the vehicle. In short, these batteries power electric motors to achieve motion.

In an embodiment, AM may optimize the layout of the vehicle systems by providing significant freedom with respect to hydrogen tank, battery and motor placement. Conventional packaging systems are constrained by available tooling. That is, in current fuel cell vehicles, packaging the hydrogen gas is a major obstacle. To obtain approximately the same range as a vehicle using a conventional internal combustion engine, a hydrogen fuel cell powertrain may require gas tanks 2-3 times larger by volume, even when the hydrogen gas is compressed to 10,000 psi. In addition to requiring high volumes and pressures, hydrogen fuel tanks are limited to using cylindrical ends to withstand the high pressure, unlike conventional gas tanks which may conform to package constraints. Additionally, these high pressure hydrogen tanks are very expensive.

Figure 17:
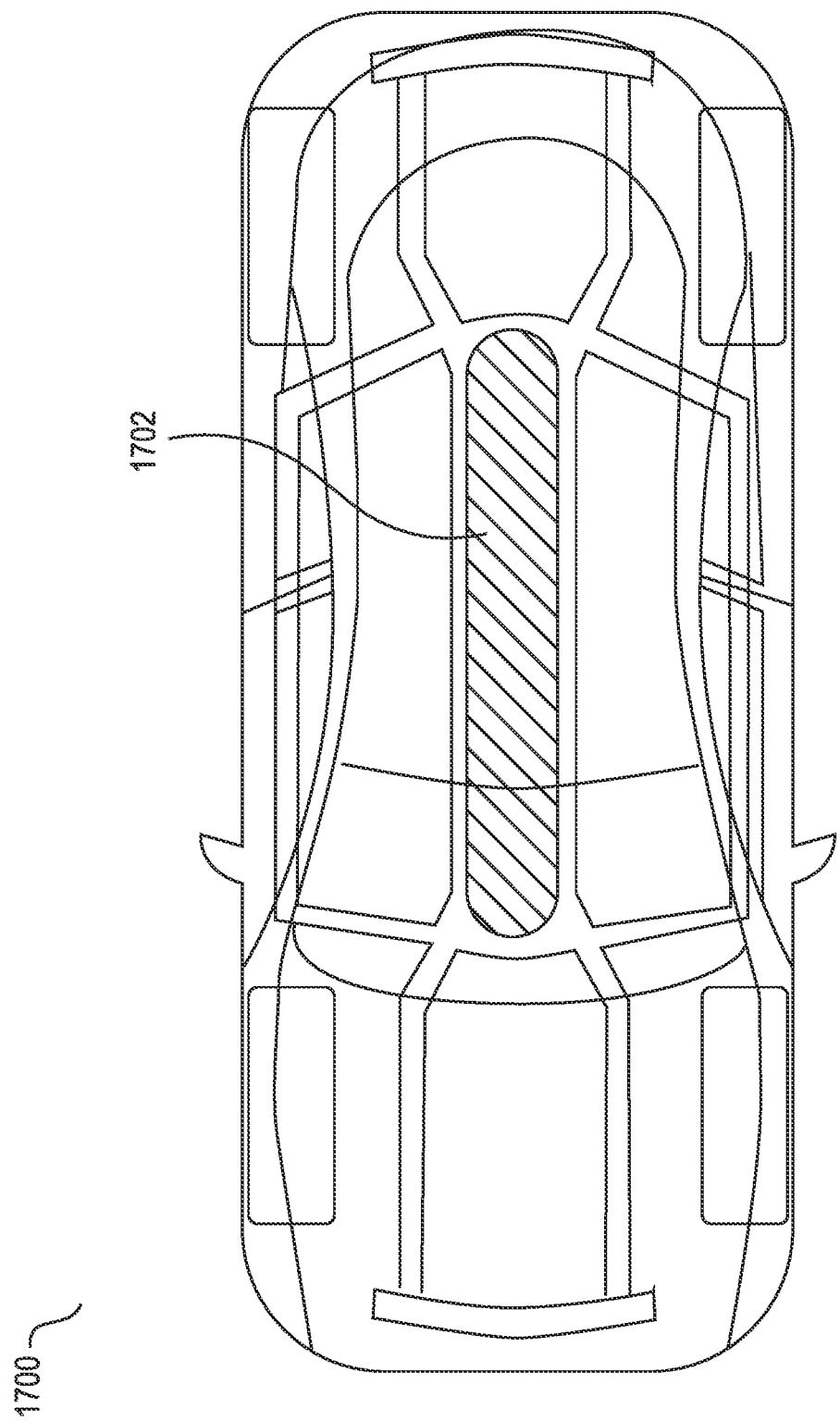
FIG. 17 is a plan view of a vehicle with a hydrogen fuel tank strategically located along the vehicle center.
Figure 18:
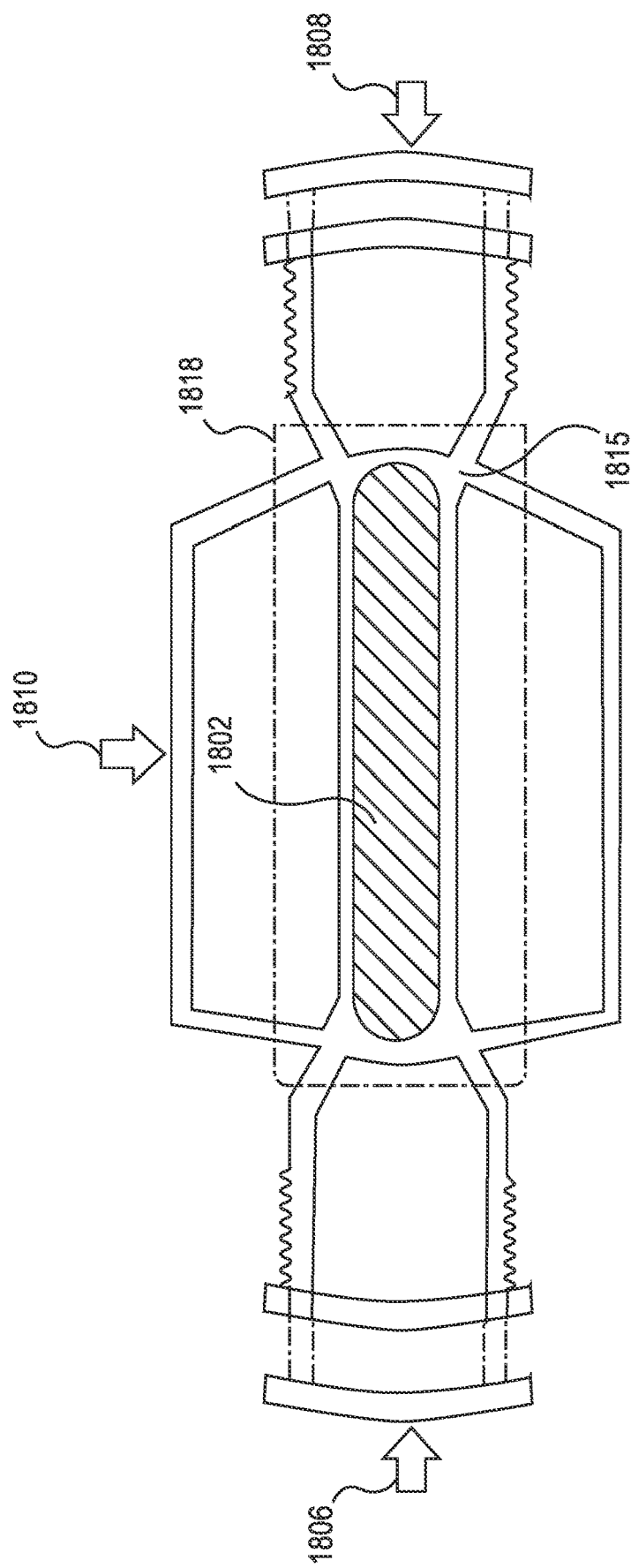
FIG. 18 is a plan view of an underbody crash structure.

FIG. 17 is a plan view of a vehicle 1700 with a hydrogen fuel tank 1702 strategically located along the vehicle center. In this figure, the hydrogen fuel tank 1702 becomes a structural 'backbone' member, located in a void space within the package. This location has a number of advantages. First, it does not compromise the vehicle package and does not require significant changes in the layout of current vehicle systems. Instead, the tanks are packaged under the floor raising heel heights and/or cargo floor height. Second, the tank doubles as a backbone to the body structure, adding torsional stiffness to the body without additional weight. Third, the potential increase in size allows a reduction in pressure, speeding up fill times and reducing tank wall thickness. This feature is especially beneficial because high pressure filing equipment is both expensive and requires a long fill time. Fourth, the central location of the tank is the safest location. This is best seen in FIG. 18, which is a plan view of an underbody crash structure. As shown in FIG. 18, the frame 1815 surrounding the backbone structure means that the rectangle 1818 defines a rigid portion of the vehicle. The fuel tank 1802 is located along the vehicle center. This location places the tank at the furthest distance away from all exterior impact points and efficiently packages the fuel in a space that is often unused in many vehicles. Thus, a front impact 1806, a rear impact 1808, and a side impact 1810 are all as far away as possible from the backbone, which gives time for the transfer of energy due to an impact to dissipate via frame 1815 and other structures.

Figure 19:
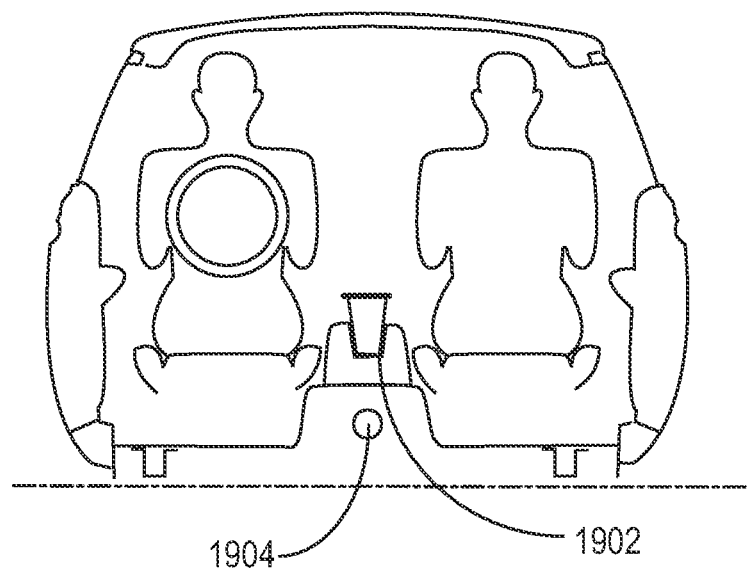
FIG. 19 is a rear view section of a traditional vehicle package.

FIG. 19 is a rear view section of a traditional vehicle package. As can be seen, between the two occupants in this view is center console 1902, which is used for storage and driver interfaces. Below the center console 1902, a floor tunnel 1904 is conventionally used to house the prop shaft and/or the exhaust system.

Figure 20:
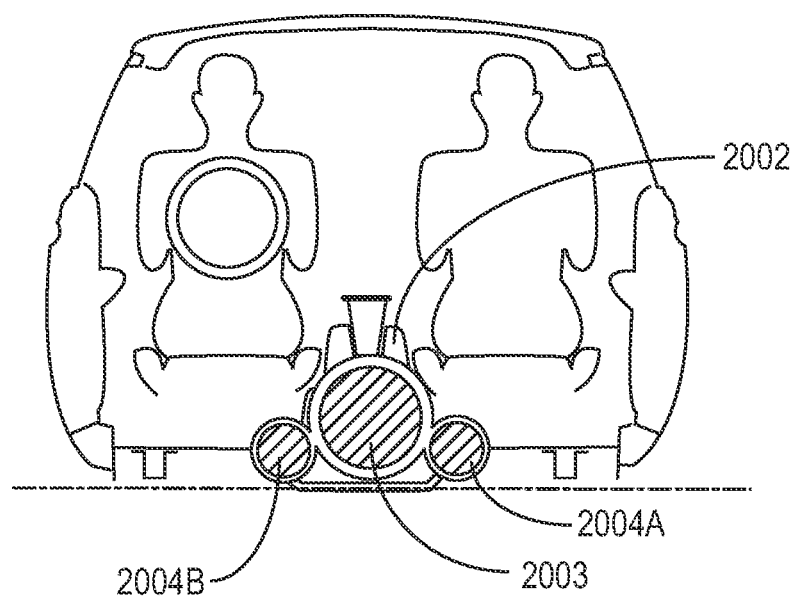
FIG. 20 is a rear view section of a 3-D printed backbone fuel tank.

FIG. 20 is a rear view section of a 3-D printed backbone fuel tank. Center console 2002 remains in position between the occupants. Hydrogen fuel tank 2003, which may be 3-D printed, is used to fill a void space. Additional tanks 2004a and 2004b can be incorporated adjacent the backbone fuel tank if necessary. As can be seen from FIG. 20, the use of the 3-D printed backbone does not compromise vehicle packaging and results in a highly efficient use of space.

Experts generally do not expect the battery efficiency driven by hydrogen to go higher. Accordingly, in an alternative exemplary embodiment, the hydrogen tank may store liquid hydrogen for use directly in an internal combustion engine. With AM technologies, hydrogen storage tanks can be designed with reinforcements to satisfy safety requirements, such as thick metal walls and custom handles to move the tank while avoiding contact with the cold temperatures. 3-D printing allows for flexibility in the placement of vehicle systems. Coupled with a modular design, customers may simply extract a used hydrogen tank and pop a filled one right in. To address some of the design and efficiency concerns around internal combustion engines (ICEs) using hydrogen as a fuel, the engines manufactured using 3-D printing can be made more efficient than current engines designed to handle smaller amounts of liquid hydrogen at a time.

Figure 21:
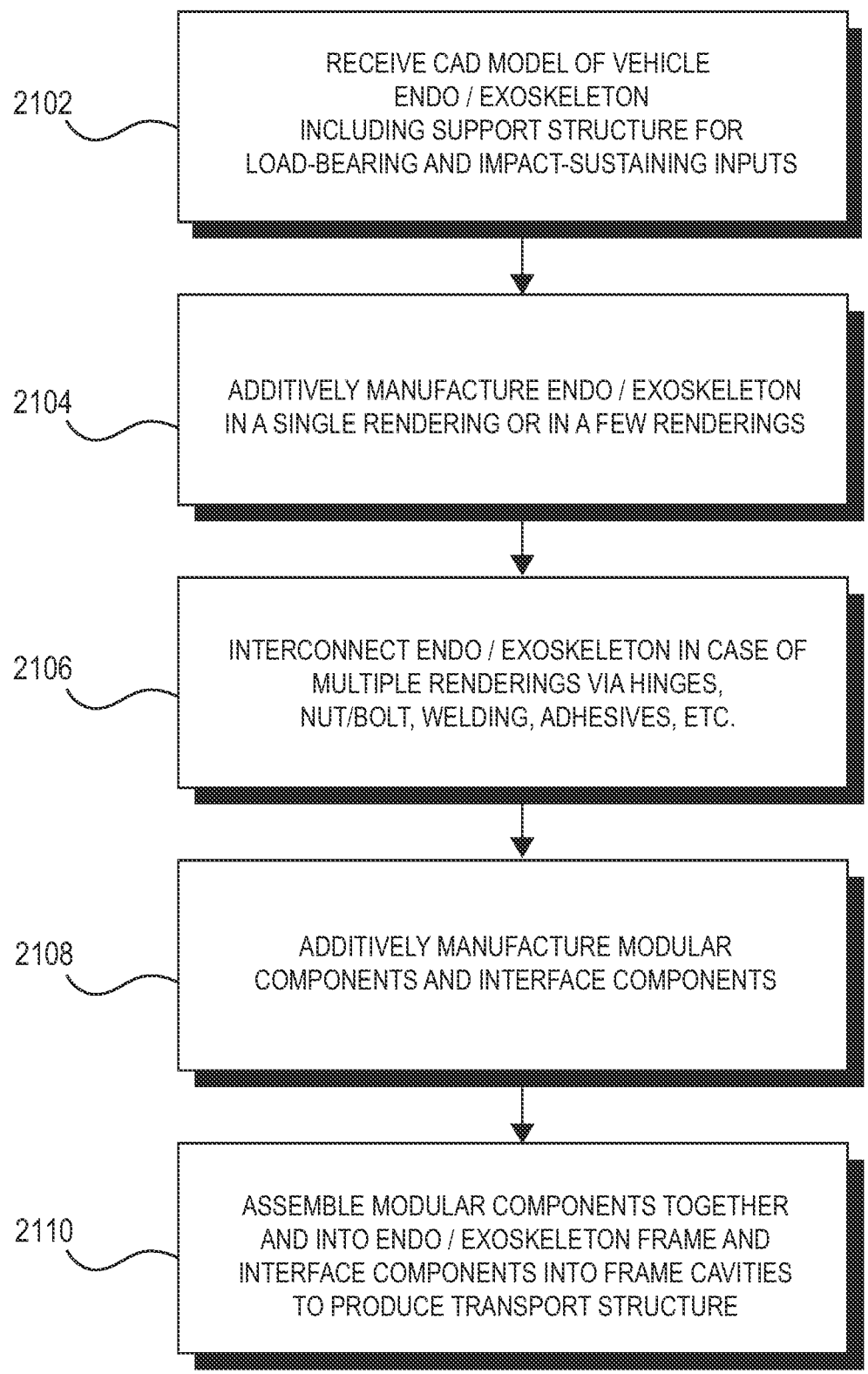
FIG. 21 is a flow diagram illustrating an exemplary method for additive manufacturing a transport structure.

FIG. 21 is a flow diagram illustrating an exemplary method for additive manufacturing a transport structure. At 2102, a CAD model of a vehicle frame (endoskeleton or exoskeleton) is received. The frame includes support for load-bearing and impact sustaining inputs.

At 2104, the endoskeleton/exoskeleton frame is additively manufactured in a single rendering or in a few renderings, the latter as a plurality of modular parts. At 2106, in the event of multiple renderings, the frame may, if necessary, be interconnected via any known technique, including welding, adhesives, interconnects, nuts/bolts, snap-in-place, etc.

At 2108, the modular components making up the internal portions of the vehicle may be additively manufactured. In an embodiment, one or more of the modular components are co-printed with the frame. Some modular components may be manufactured using other methods such as subtractive manufacturing. At 2110, the modular components are assembled together into the frame and the interface components (modular components that interface externally from the frame) are inserted into the frame cavities to produce the transport structure.

The previous description is provided to enable any person skilled in the art to practice the various aspects described herein. Various modifications to these exemplary embodiments presented throughout this disclosure will be readily apparent to those skilled in the art, and the concepts disclosed herein may be applied to other techniques for printing nodes and interconnects. Thus, the claims are not intended to be limited to the exemplary embodiments presented throughout the disclosure, but are to be accorded the full scope consistent with the language claims. All structural and functional equivalents to the elements of the exemplary embodiments described throughout this disclosure that are known or later come to be known to those of ordinary skill in the art are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f), or analogous law in applicable jurisdictions, unless the element is expressly recited using the phrase "means for" or, in the case of a method claim, the element is recited using the phrase "step for."

What is claimed is:

1. A transport structure, comprising:
   a 3-D printed frame comprising at least one releasably detachable nosecone structure, and wherein the frame is configured to accept road loads and includes at least one or more safety cells to protect an occupant in an impact event;
   a plurality of cavities, protruding through the 3-D printed frame, for receiving components that use an external interface; and
   a body disposed over an exterior surface of the 3-D printed frame.

2. The transport structure of claim 1, further comprising a set of general components integrated at least in part in the 3-D printed frame.

3. The transport structure of claim 2, wherein at least a portion of the set of general components comprise modular components.

4. The transport structure of claim 3, wherein a subset of the set of general components comprises the components that use an external interface.

5. The transport structure of claim 1, wherein the body is 3-D printed.

6. The transport structure of claim 1, wherein the 3-D printed frame is 3-D printed in a single rendering.

7. The transport structure of claim 1, wherein the body is co-printed with the 3-D printed frame in sections or in a single rendering.

8. The transport structure of claim 1, wherein the at least one nosecone is coupled to one or both of a front and rear surface of the 3-D printed frame.

9. The transport structure of claim 8, wherein the at least one nosecone is covered with a section of foam or lattice.

10. The transport structure of claim 9, wherein the foam or lattice is 3-D printed.

11. The transport structure of claim 8 wherein the at least one nosecone coupled to the front surface of the 3-D printed frame is configured to mate with a hinge post platform having interfacing centers.

12. The transport structure of claim 4, wherein the set of general components comprises a 3-D printed pedal disposed on a floor panel.

13. The transport structure of claim 8, further comprising a front impact beam mounted to a front surface of the at least one nosecone coupled to the front surface of the 3-D printed frame.

14. The transport structure of claim 8, further comprising a front suspension system mounted to an inner portion of the at least one nosecone coupled to the front surface of the 3-D printed frame.

15. The transport structure of claim 1, further comprising a rear suspension system mounted to a rear portion of the 3-D printed frame.

16. The transport structure of claim 1, wherein the 3-D printed frame comprises a safety cell configured to protect an occupant in an event impact.

17. The transport structure of claim 1, wherein the body comprises at least one of foam, 3-D printed metal or 3-D printed plastic.

18. The transport structure of claim 1, wherein the body is optimized for aerodynamic performance and the 3-D printed frame is optimized for accepting structural loads.

19. The transport structure of claim 4, wherein the set of general components comprises 3-D printed joining members.

20. The transport structure of claim 4, wherein the set of general components comprises a hinge positioned between a control arm and the body.

21. The transport structure of claim 20, wherein the control arm is co-printed with the body, the body having a nominal gap.

22. The transport structure of claim 20, wherein the set of general components comprises a 3-D printed housing for an electric motor with the control arm.

23. The transport structure of claim 21, wherein the nominal gap is filled with an elastomer configured to provide spring and rotational characteristics to the control arm.

24. The transport structure of claim 15, wherein the body or frame comprises a plurality of joints characterizing sections of the vehicle that are configured to fail in the impact event.

25. The transport structure of claim 4, wherein the set of components comprises a 3-D printed dashboard assembly.

26. The transport structure of claim 25, wherein the 3-D printed dashboard assembly comprises a plurality of apertures and mounts configured to house dash components.

27. The transport structure of claim 4, wherein the set of general components further comprises one or more 3-D printed pillars or vehicle rails.

28. The transport structure of claim 25, wherein the dashboard assembly comprises box sections for enabling air distribution.

29. The transport structure of claim 4, wherein the set of general components comprises a packaging system for a hydrogen fuel tank including a plurality of hydrogen fuel cells.

30. The transport structure of claim 29, wherein the packaging system is located in or near a central region of the transport structure.

31. The transport structure of claim 29, wherein the plurality of hydrogen fuels cells comprise modular components wherein used fuel cells are replaceable.

32. The transport structure of claim 1, wherein the nosecone structure further comprises a foam or lattice structure that surrounds the nosecone structure, and connects the nosecone structure to the frame.

33. A method for producing a transport structure, comprising:
- 3-D printing a frame, the 3-D printed frame comprising at least one releasably detachable nosecone structure, wherein the frame is configured to accept road loads and includes at least one or more safety cells to protect an occupant in an impact event;
- forming a body over an exterior surface of the 3-D printed frame; and
- assembling a plurality of modular components into the 3-D printed frame,
- wherein the 3-D printed frame comprises a plurality of cavities for receiving components of the plurality of modular components that use an external interface.

34. The method of claim 33, further comprising 3-D printing the body.

35. The method of claim 33, further comprising 3-D printing the frame in a single rendering.

36. The method of claim 33, further comprising co-printing the body with the frame in sections or in a single rendering.

37. The method of claim 33, further comprising coupling at least one nosecone respectively to one or both of a front and rear surface of the 3-D printed frame.

38. The method of claim 37, further comprising covering the at least one nosecone with a section of foam or lattice.

39. The method of claim 38, further comprising 3-D printing the foam or lattice.

40. The method of claim 37, further comprising mounting a front suspension system to an inner portion of the at least one nosecone coupled to the front surface of the 3-D printed frame.

41. The method of claim 40, further comprising mounting a rear suspension system to a rear surface of the 3-D printed frame.

42. The method of claim 33, wherein the 3-D printed frame comprises a safety cell configured to protect an occupant in an event impact.

43. The method of claim 33, wherein the body comprises at least one of foam, 3-D printed metal or 3-D printed plastic.

44. The method of claim 33, further comprising optimizing the body for aerodynamic performance and the 3-D printed frame for accepting structural loads.

45. The method of claim 33, further comprising 3-D printing a dashboard assembly for assembly within the frame.

46. The method of claim 33, further comprising surrounding the nosecone structure with a foam or lattice structure and attaching the nosecone structure to the frame through the foam or lattice structure.

* * * * *